United States Patent
Park et al.

(10) Patent No.: US 12,183,769 B2
(45) Date of Patent: Dec. 31, 2024

(54) DISPLAY DEVICE AND METHOD OF MANUFACTURING THE SAME

(71) Applicant: Samsung Display Co., Ltd., Yongin-si (KR)

(72) Inventors: Mi Jin Park, Yongin-si (KR); Jin Sun Kim, Yongin-si (KR); Jin Yeong Kim, Yongin-si (KR); Sang Ho Park, Yongin-si (KR); Keun Kyu Song, Yongin-si (KR); Woo Guen Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 482 days.

(21) Appl. No.: 17/373,346

(22) Filed: Jul. 12, 2021

(65) Prior Publication Data

US 2022/0052108 A1 Feb. 17, 2022

(30) Foreign Application Priority Data

Aug. 12, 2020 (KR) .......................... 10-2020-0101426

(51) Int. Cl.
*H01L 33/00* (2010.01)
*H01L 27/15* (2006.01)
(Continued)

(52) U.S. Cl.
CPC ........ *H01L 27/156* (2013.01); *H01L 33/0041* (2013.01); *H01L 33/005* (2013.01);
(Continued)

(58) Field of Classification Search
CPC ............... H01L 25/167; H01L 25/0753; H01L 21/76895; H01L 33/0045; H01L 33/26;
(Continued)

(56) References Cited

U.S. PATENT DOCUMENTS 8,541,791 B2 * 9/2013 Espiau De Lamaestre ................
H01L 33/0041
257/87
8,872,214 B2 10/2014 Negishi et al.
(Continued)

FOREIGN PATENT DOCUMENTS

KR 10-2006-0075586 7/2006
KR 10-1244926 B1 3/2013
(Continued)

OTHER PUBLICATIONS

International Search Report issued Nov. 16, 2021 in corresponding International Application No. PCT/KR2021/009891 filed Jul. 29, 2021, 3 pages.

*Primary Examiner* — Eduardo A Rodela
(74) *Attorney, Agent, or Firm* — Lewis Roca Rothgerber Christie LLP

(57) ABSTRACT

A display device and a method of manufacturing the same are provided. A display device includes: a substrate including a plurality of pixels; a first electrode and a second electrode spaced apart from each other on the substrate; a light emitting element located between the first electrode and the second electrode; and a conductive pattern on the light emitting element. The light emitting element includes a first semiconductor layer, a second semiconductor layer, and an active layer between the first semiconductor layer and the second semiconductor layer, and the conductive pattern overlaps the active layer and does not overlap the first semiconductor layer or the second semiconductor layer.

25 Claims, 14 Drawing Sheets

(51) Int. Cl.
  *H01L 33/38* (2010.01)
  *H01L 33/62* (2010.01)
  *H10K 59/70* (2023.01)
(52) U.S. Cl.
  CPC .......... *H01L 33/382* (2013.01); *H01L 33/387* (2013.01); *H01L 33/62* (2013.01); *H10K 59/70* (2023.02); *H01L 2933/0016* (2013.01)
(58) Field of Classification Search
  CPC . H01L 33/0041; H01L 27/156; H01L 33/005; H01L 33/382; H01L 33/387; H01L 33/62; H01L 2933/0016; H10K 59/70
  See application file for complete search history.

(56) References Cited

U.S. PATENT DOCUMENTS

| | | | |
|---|---|---|---|
| 9,112,112 B2 | 8/2015 | Do et al. | |
| 9,178,005 B2 | 11/2015 | Kim | |
| 9,773,761 B2 | 9/2017 | Do | |
| 12,021,174 B2* | 6/2024 | Kim | H01L 33/387 |
| 2007/0221944 A1* | 9/2007 | Cheol Yoo | H01L 33/387 |
| | | | 257/79 |
| 2011/0089850 A1 | 4/2011 | Shibata et al. | |
| 2021/0280746 A1 | 9/2021 | Kim et al. | |
| 2022/0059739 A1* | 2/2022 | Li | H01L 33/54 |

FOREIGN PATENT DOCUMENTS

| | | | |
|---|---|---|---|
| KR | 10-2014-0142519 | 12/2014 | |
| KR | 10-1490758 B1 | 2/2015 | |
| KR | 10-2019-0006430 A | 1/2019 | |
| KR | 10-2020-0005711 A | 1/2020 | |
| KR | 10-2020-0011629 | 2/2020 | |
| KR | 10-2020-0077671 | 7/2020 | |
| WO | WO-2020130249 A1 * | 6/2020 | ......... H01L 25/0753 |

* cited by examiner

DISPLAY DEVICE AND METHOD OF MANUFACTURING THE SAME

CROSS-REFERENCE TO RELATED-APPLICATION

This application claims priority to and the benefit of Korean Patent Application No. 10-2020-0101426, filed on Aug. 12, 2020 in the Korean Intellectual Property Office, the entire content of which is hereby incorporated by reference.

BACKGROUND

1. Field

Aspects of embodiments of the present disclosure relate to a display device and a method of manufacturing the same.

2. Description of Related Art

In recent years, interest in information display is increasing. Accordingly, research and development for a display device are continuously being conducted.

SUMMARY

According to an aspect of one or more embodiments of the present disclosure, a display device with improved light emission efficiency and a method of manufacturing the same are provided.

However, aspects of the present disclosure are not limited to the above-described aspects, and other technical aspects and objects which are not described will be clearly understood by those skilled in the art from the following description.

According to one or more embodiments, a display device includes: a substrate including a plurality of pixels; a first electrode and a second electrode spaced apart from each other on the substrate; a light emitting element located between the first electrode and the second electrode; and a conductive pattern on the light emitting element, and the light emitting element includes a first semiconductor layer, a second semiconductor layer, and an active layer between the first semiconductor layer and the second semiconductor layer, and the conductive pattern overlaps the active layer and does not overlap the first semiconductor layer or the second semiconductor layer.

The display device may further include an insulating pattern between the light emitting element and the conductive pattern.

The insulating pattern may partially expose the first semiconductor layer and the second semiconductor layer.

The conductive pattern may be disposed directly on the insulating pattern.

The display device may further include a first contact electrode electrically connected to the first electrode and the first semiconductor layer, and a second contact electrode electrically connected to the second electrode and the second semiconductor layer.

The first contact electrode and the second contact electrode may be on the conductive pattern.

The first contact electrode may not overlap the second semiconductor layer.

The first contact electrode may be between the conductive pattern and the second contact electrode.

The first contact electrode may be disposed directly on the conductive pattern.

The display device may further include an insulating layer between the first contact electrode and the second contact electrode, and the insulating layer may cover the conductive pattern.

A width of the conductive pattern in a first direction may be less than a width of the light emitting element in the first direction.

A width of the conductive pattern in a first direction may be the same as a width of the active layer in the first direction.

The display device may further include an insulating layer between the first electrode and the second electrode and the conductive pattern.

The display device may include a first region overlapping the first semiconductor layer and a second region overlapping the second semiconductor layer, and the insulating layer of the first region may include a first dopant.

The first semiconductor layer may include the first dopant.

The conductive pattern may include the first dopant.

The insulating layer of the second region may include a second dopant different from the first dopant.

The second semiconductor layer may include the second dopant.

The conductive pattern may include the second dopant.

The display device may further include an insulating layer covering the first contact electrode and the second contact electrode, and a plurality of transistors on the insulating layer and electrically connected to the plurality of pixels, and the transistors may be electrically connected to the first electrode or the second electrode through a contact hole passing through the insulating layer.

According to one or more embodiments, a method of manufacturing a display device includes: providing an active pattern between a first electrode and a second electrode that are spaced apart from each other; and forming a light emitting element by doping a dopant region of the active pattern, and forming the light emitting element includes: providing a conductive material layer exposing a first dopant region of the active pattern; forming a first semiconductor layer by doping a first dopant in the first dopant region; forming a conductive pattern exposing a second dopant region of the active pattern by patterning the conductive material layer; and forming a second semiconductor layer by doping a second dopant different from the first dopant in the second dopant region.

The method may further include forming a first contact electrode on the first semiconductor layer.

The first contact electrode may expose the second dopant region.

The method may further include forming an insulating layer covering the first contact electrode and the conductive pattern.

The method may further include forming a second contact electrode on the second semiconductor layer.

The conductive material layer may cover the second dopant region.

The active pattern may include an active layer between the first dopant region and the second dopant region.

The conductive pattern may be formed to overlap the active layer.

Further details of the above-described and other embodiments are included in the below detailed description and drawings.

According to an aspect of one or more embodiments of the disclosure, after light emitting elements are first supplied and aligned in an active pattern state, each dopant region is doped to form a first semiconductor having a first conductivity type and a second semiconductor layer having a second conductivity type. Accordingly, a bias degree of the light emitting elements may be improved, and, thus, light emission efficiency of the display device may be improved.

However, aspects and effects according to embodiments are not limited by those described above, and further various aspects and effects are included in the present specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1:
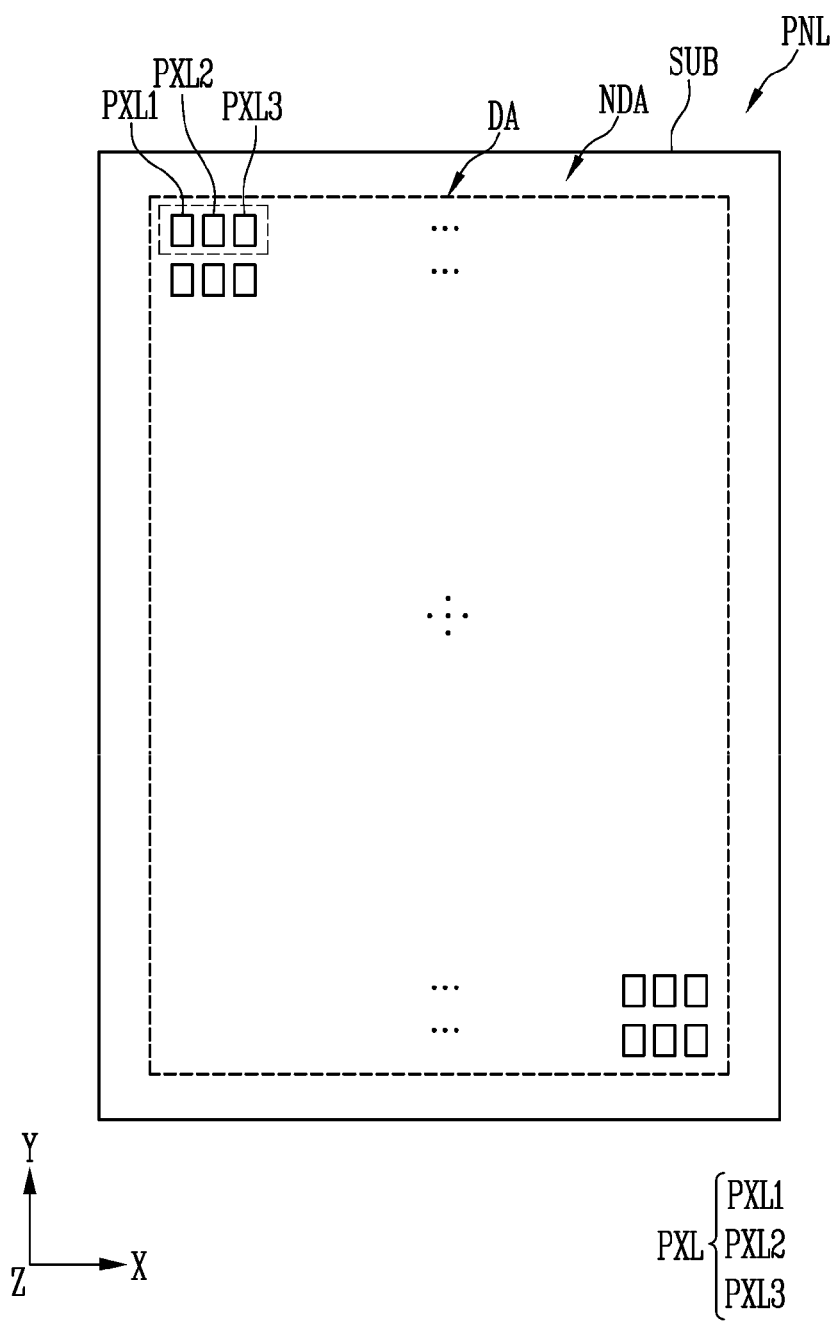
FIG. 1 is a plan view illustrating a display device according to an embodiment.

Aspects and features of the disclosure and a method of achieving them will become apparent with reference to the embodiments described in further detail below together with the accompanying drawings. However, the disclosure is not limited to the embodiments disclosed below, and may be implemented in various different forms. The described embodiments are provided so that the disclosure will be thorough and complete and those skilled in the art to which the disclosure pertains can fully understand the scope of the disclosure. The disclosure is defined by the scope of the claims.

The terms used in the present specification are for describing embodiments and are not intended to limit the disclosure. In the present specification, the singular form also includes the plural form unless otherwise specified. The term "comprises" and/or "comprising" does not exclude presence or addition of one or more other components, steps, operations, and/or elements to the described component, step, operation, and/or element.

In addition, the term "coupling" or "connection" may collectively mean a physical and/or electrical coupling or connection. In addition, this may collectively mean a direct or indirect coupling or connection and an integral or non-integral coupling or connection.

A case in which an element or a layer is referred to as "on" another element or layer includes a case in which another layer or another element is disposed directly on the other layer or element or in which one or more layers or elements are disposed therebetween. The same reference numerals denote the same components throughout the specification.

Although the terms "first," "second," and the like may be used to describe various components, these components are not limited by these terms. These terms are used to distinguish one component from another component. Therefore, a first component described below may be a second component within the technical spirit of the disclosure.

Also, the terms "under," "below," "above," "upper," and the like may be used herein to explain a relationship between one or more components shown in the drawings. However, the terms may be relative terms describing the positions of components in the drawings and are not to be interpreted as limiting an orientation.

Unless otherwise defined, all terms (including technical and scientific terms) used herein have the same meaning as commonly understood by one of ordinary skill in the art to which the present invention belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

Herein, embodiments of the disclosure are described in further detail with reference to the accompanying drawings.

FIG. 1 is a plan view illustrating a display device according to an embodiment.

In FIG. 1, a display device, in particular, a display panel PNL provided in the display device is shown, and, for convenience of description, a structure of the display panel PNL is schematically shown centering on a display area DA. However, according to an embodiment, the display panel PNL may further include at least one driving circuit unit (for example, at least one of a scan driver and a data driver), lines, and/or pads, which are not shown.

Referring to FIG. 1, the display panel PNL may include a substrate SUB and a plurality of pixels PXL disposed on the substrate SUB. The plurality of pixels PXL may include a first pixel PXL1, a second pixel PXL2, and/or a third pixel PXL3. Herein, when at least one of the first pixel PXL1, the second pixel PXL2, and the third pixel PXL3 is arbitrarily referred to, or when two or more types of pixels are collectively referred to, at least one of the first pixel PXL1, the second pixel PXL2, and the third pixel PXL3 or two or more types of pixels may be referred to as a "pixel (PXL)" or "pixels PXL".

The substrate SUB configures a base member of the display panel PNL, and may be a rigid or flexible substrate or film. For example, the substrate SUB may be a rigid substrate formed of glass or tempered glass, a flexible substrate (or a thin film) formed of plastic or metal, or an insulating layer of at least one layer. The material and/or a material property of the substrate SUB are not particularly limited.

In an embodiment, the substrate SUB may be substantially transparent. Here, "substantially transparent" may mean that light may be transmitted at a predetermined transmittance or more. In another embodiment, the substrate SUB may be translucent or opaque. In addition, the substrate SUB may include a reflective material according to an embodiment.

The display panel PNL and the substrate SUB for forming the same may include the display area DA for displaying an image and a non-display area NDA except for the display area DA.

The pixels PXL may be disposed in the display area DA. Various lines, pads, and/or a built-in circuit unit connected to the pixels PXL of the display area DA may be disposed in the non-display area NDA. The pixels PXL may be regularly arranged according in a stripe or pentile arrangement structure, or the like. However, an arrangement structure of the pixels PXL is not limited thereto, and the pixels PXL may be arranged in the display area DA in any of various structures and/or methods.

According to an embodiment, two or more types of pixels PXL emitting light of different colors may be disposed in the display area DA. For example, in the display area DA, a first pixel PXL1 emitting light of a first color, a second pixel PXL2 emitting light of a second color, and a third pixel PXL3 emitting light of a third color may be arranged. For example, each of the first to third pixels PXL1, PXL2, and PXL3 may be a sub pixel emitting light of a color (e.g., a predetermined color). According to an embodiment, the first pixel PXL1 may be a red pixel emitting red light, the second pixel PXL2 may be a green pixel emitting green light, and the third pixel PXL3 may be a blue pixel emitting blue light, but are not limited thereto.

In an embodiment, the first pixel PXL1, the second pixel PXL2, and the third pixel PXL3 may include a light emitting element of the first color, a light emitting element of the second color, and a light emitting element of the third color as a light source, to emit light of the first color, the second color, and the third color, respectively. In another embodiment, the first pixel PXL1, the second pixel PXL2, and the third pixel PXL3 may include light emitting elements that emit light of the same color, and may include a color conversion layer and/or a color filter of different colors disposed on the respective light emitting elements, to emit light of the first color, the second color, and the third color, respectively. However, the color, type, number, and/or the like of pixels PXL configuring each pixel PXL are not particularly limited. That is, the color of light emitted by each pixel PXL may be variously changed.

In an embodiment, the pixel PXL may include at least one light source driven by a control signal (e.g., a predetermined control signal) (for example, a scan signal and a data signal) and/or power (e.g., predetermined power) (for example, first power and second power). In an embodiment, the light source may include ultra-small light emitting elements (LD of FIG. 5 or the like) having a size as small as nano scale to micro scale. However, the disclosure is not limited thereto, and any of various types of light emitting elements may be used as the light source of the pixel PXL.

In an embodiment, each pixel PXL may be configured as an active pixel. However, the type, structure, and/or driving method of the pixels PXL applicable to the display device are not particularly limited. For example, each pixel PXL may be configured as a pixel of a passive or active light emitting display device having any of various structures and/or driving methods.

Figure 2:
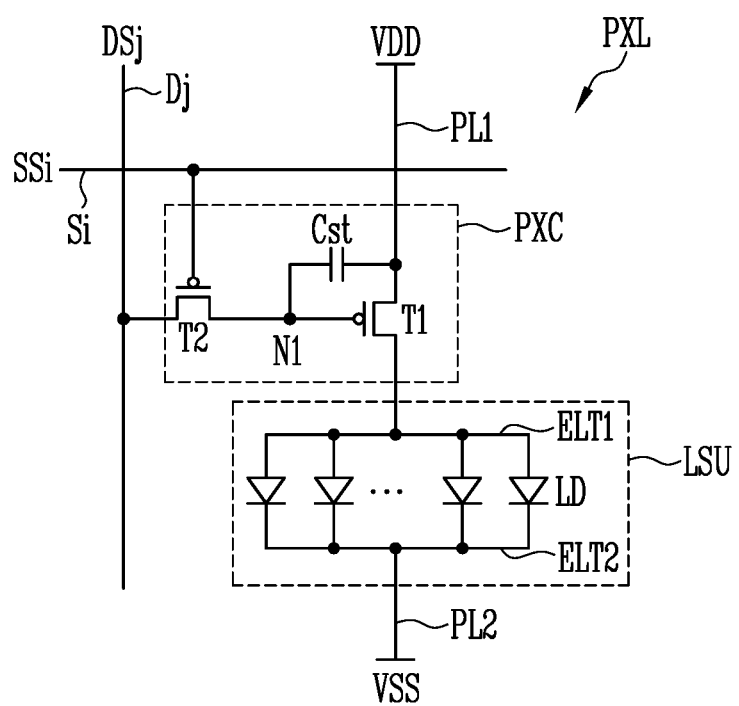
FIGS. 2 to 4 are circuit diagrams illustrating a pixel according to some embodiments.
Figure 3:
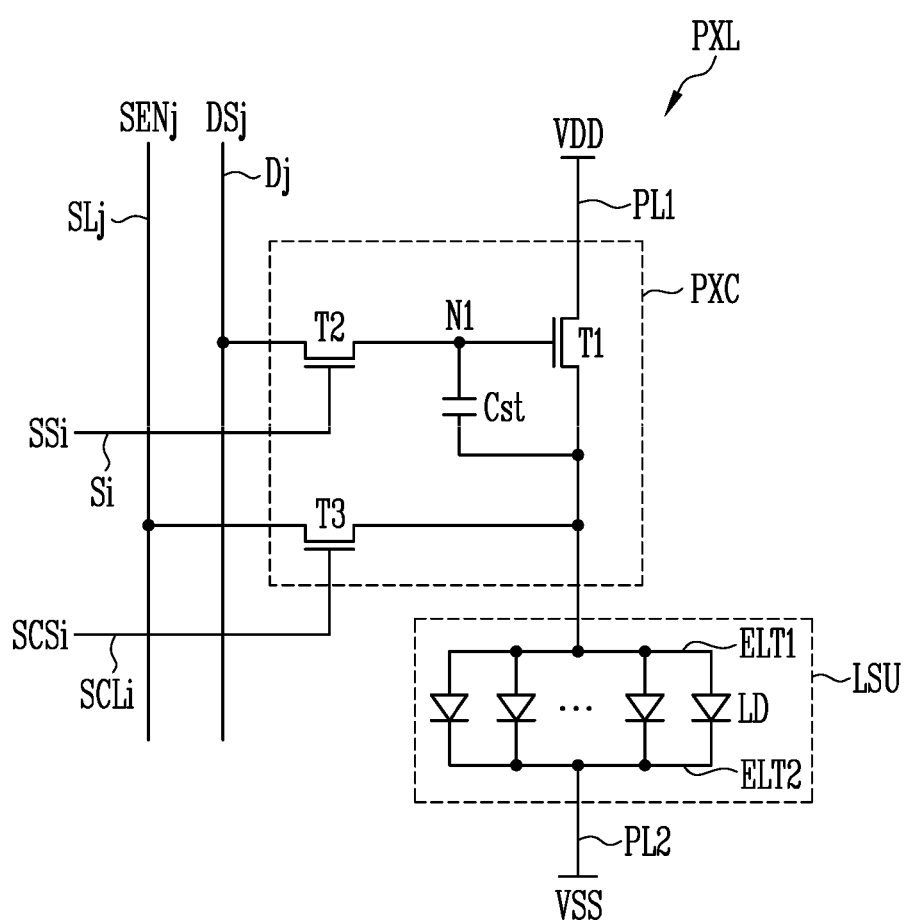
Figure 4:
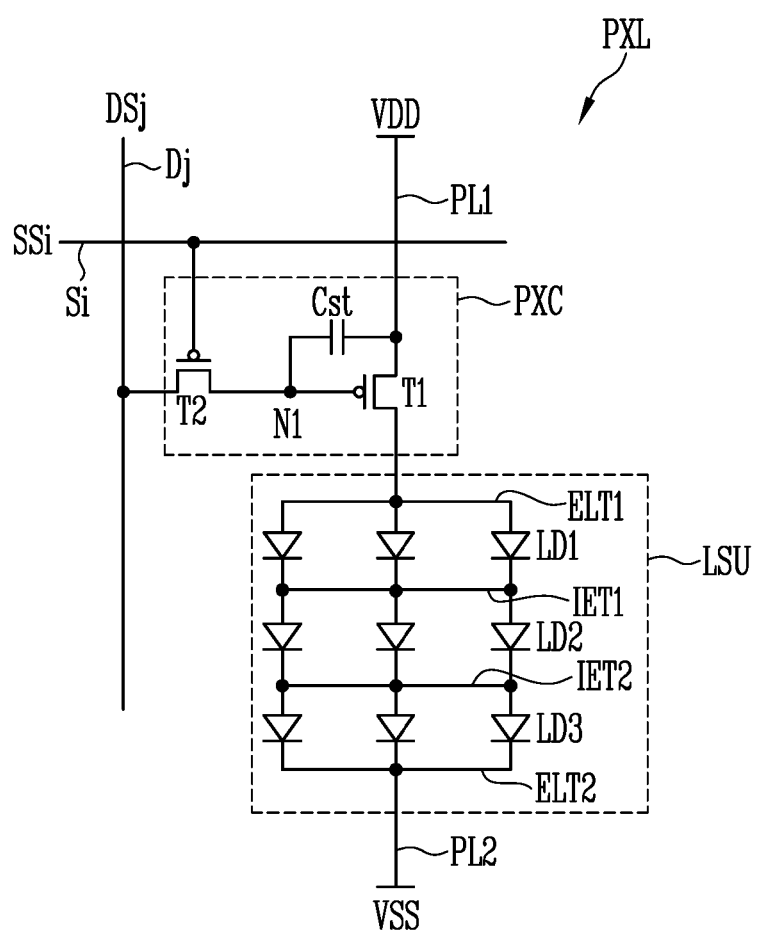

FIGS. 2 to 4 are circuit diagrams illustrating a pixel according to some embodiments. For example, FIGS. 2 to 4 illustrate some embodiments of the pixel PXL applicable to an active display device. However, types of the pixel PXL and the display device are not limited thereto.

According to an embodiment, the pixel PXL shown in FIGS. 2 to 4 may be any one of the first pixel PXL1, the second pixel PXL2, and the third pixel PXL3 provided in the display panel PNL of FIG. 1. The first pixel PXL1, the second pixel PXL2, and the third pixel PXL3 may have a structure substantially the same as or similar to each other.

Referring to FIG. 2, the pixel PXL may include a light source unit LSU for generating light having a luminance corresponding to a data signal, and a pixel circuit PXC for driving the light source unit LSU.

The light source unit LSU may include at least one light emitting element LD connected between first power VDD and second power VSS. For example, the light source unit LSU may include a first electrode ELT1 (also referred to as a "first pixel electrode" or a "first alignment electrode") connected to the first power VDD via the pixel circuit PXC, a second electrode ELT2 (also referred to as a "second pixel electrode" or a "second alignment electrode") connected to the second power VSS through a second power line PL2, a plurality of light emitting elements LD connected in the same direction between the first and second electrodes ELT1 and ELT2. In an embodiment, the first electrode ELT1 may be an anode electrode, and the second electrode ELT2 may be a cathode electrode.

Each of the light emitting elements LD may include a first end (for example, a P-type end) connected to the first power VDD through the first electrode ELT1 and/or the pixel circuit PXC, and a second end (for example, an N-type end) connected to the second power VSS through the second electrode ELT2. That is, the light emitting elements LD may be connected in parallel in a forward direction between the first and second electrodes ELT1 and ELT2. Each light emitting element LD connected in the forward direction between the first power VDD and the second power VSS may configure each effective light source, and the effective light sources may be gathered to configure the light source unit LSU of the pixel PXL.

The first power VDD and the second power VSS may have different potentials such that the light emitting elements LD may emit light. For example, the first power VDD may be set as a high potential power, and the second power VSS may be set as a low potential power. At this time, a potential difference between the first power VDD and the second power VSS may be set to be equal to or greater than a threshold voltage of the light emitting elements LD during an emission period of the pixel PXL.

One end (for example, the P-type end) of the light emitting elements LD configuring each light source unit LSU may be commonly connected to the pixel circuit PXC through one electrode (for example, the first electrode ELT1 of each pixel PXL) of the light source unit LSU, and may be connected to the first power VDD through the pixel circuit PXC and a first power line PL1. Another end (for example, the N-type end) of the light emitting elements LD may be commonly connected to the second power VSS through another electrode (for example, the second electrode ELT2 of each pixel PXL) of the light source unit LSU and the second power line PL2.

The light emitting elements LD may emit light at a luminance corresponding to a driving current supplied through the pixel circuit PXC. For example, during each frame period, the pixel circuit PXC may supply a driving current corresponding to a grayscale value to be expressed in a corresponding frame to the light source unit LSU. The driving current supplied to the light source unit LSU may divide and flow to the light emitting elements LD connected in the forward direction. Accordingly, while each light emitting element LD emits light at a luminance corresponding to the current flowing therethrough, the light source unit LSU may emit light of the luminance corresponding to the driving current.

The pixel circuit PXC may be connected between the first power VDD and the first electrode ELT1. The pixel circuit PXC may be connected to a scan line Si and a data line Dj of the pixel PXL. For example, when the pixel PXL is disposed on an i-th (i is a natural number) horizontal line (row) and a j-th (j is a natural number) vertical line (column) of the display area DA, the pixel circuit PXC of the pixel PXL may be connected to an i-th scan line Si and a j-th data line Dj of the display area DA.

According to an embodiment, the pixel circuit PXC may include a plurality of transistors and at least one capacitor.

For example, the pixel circuit PXC may include a first transistor T1, a second transistor T2, and a storage capacitor Cst.

The first transistor T1 is connected between the first power VDD and the light source unit LSU. For example, a first electrode (for example, a source electrode) of the first transistor T1 may be connected to the first power VDD, and a second electrode (for example, a drain electrode) of the first transistor T1 may be connected to the first electrode ELT1. A gate electrode of the first transistor T1 is connected to a first node N1. The first transistor T1 controls the driving current supplied to the light source unit LSU in correspondence with a voltage of the first node N1. That is, the first transistor T1 may be a driving transistor that controls the driving current of the pixel PXL.

The second transistor T2 is connected between the data line Dj and the first node N1. For example, a first electrode (for example, a source electrode) of the second transistor T2 may be connected to the data line Dj, and a second electrode (for example, a drain electrode) of the second transistor T2 may be connected to the first node N1. A gate electrode of the second transistor T2 is connected to the scan line Si. The second transistor T2 may be turned on when a scan signal SSi of a gate-on voltage (for example, a low level voltage) is supplied from the scan line Si, to electrically connect the data line Dj and the first node N1.

In each frame period, a data signal DSj of a corresponding frame is supplied to the data line Dj, and the data signal DSj is transferred to the first node N1 through the second transistor T2 which is turned on during a period in which the scan signal SSi of the gate-on voltage is supplied. That is, the second transistor T2 may be a switching transistor for transferring each data signal DSj to the pixel PXL.

One electrode of the storage capacitor Cst is connected to the first power VDD, and another electrode is connected to the first node N1. The storage capacitor Cst charges a voltage corresponding to the data signal DSj supplied to the first node N1 during each frame period.

In an embodiment, in FIG. 2, all transistors included in the pixel circuit PXC, for example, the first and second transistors T1 and T2 are P-type transistors, but are not limited thereto, and at least one of the first and second transistors T1 and T2 may be an N-type transistor. In addition, the pixel circuit PXC may be configured with a pixel circuit of any of various structures and/or driving methods.

Referring to FIG. 3, in an embodiment, the pixel circuit PXC may be further connected to a sensing control line SCLi and a sensing line SLj. For example, the pixel circuit PXC of the pixel PXL disposed on the i-th horizontal line and the j-th vertical line of the display area DA may be connected to an i-th sensing control line SCLi and a j-th sensing line SLj of the display area DA. The pixel circuit PXC may further include a third transistor T3. In another embodiment, the sensing line SLj may be omitted, and a characteristic of the pixel PXL may be detected by detecting a sensing signal SENj through the data line Dj of a corresponding pixel PXL (or an adjacent pixel).

The third transistor T3 is connected between the first transistor T1 and the sensing line SLj. For example, one electrode of the third transistor T3 may be connected to one electrode (for example, the source electrode) of the first transistor T1 connected to the first electrode ELT1, and another electrode of the third transistor T3 may be connected to the sensing line SLj. In an embodiment, when the sensing line SLj is omitted, the other electrode of the third transistor T3 may be connected to the data line Dj.

A gate electrode of the third transistor T3 is connected to the sensing control line SCLi. In an embodiment, when the sensing control line SCLi is omitted, the gate electrode of the third transistor T3 may be connected to the scan line Si. The third transistor T3 is turned on by a sensing control signal SCSi of a gate-on voltage (for example, a high level voltage) supplied to the sensing control line SCLi during a sensing period (e.g., a predetermined sensing period), to electrically connect the sensing line SLj and the first transistor T1.

According to an embodiment, the sensing period may be a period for extracting a characteristic (for example, a threshold voltage of the first transistor T1) of each of the pixels PXL disposed in the display area DA. During the sensing period, the first transistor T1 may be turned on by supplying a reference voltage (e.g., a predetermined reference voltage) that may turn on the first transistor T1 to the first node N1 through the data line Dj and the second transistor T2 or connecting each pixel PXL to a current source or the like. In addition, the first transistor T1 may be connected to the sensing line SLj by turning on the third transistor T3 by supplying the sensing control signal SCSi of a gate-on voltage to the third transistor T3. Thereafter, the sensing signal SENj may be obtained through the sensing line SLj, and the characteristic of each pixel PXL, including the threshold voltage of the first transistor T1, may be detected using the sensing signal SENj. Information of the characteristic of each pixel PXL may be used to convert image data such that a characteristic deviation between the pixels PXL disposed in the display area DA may be compensated.

In FIG. 3, an embodiment in which all of the first, second, and third transistors T1, T2, and T3 are N-type transistors is illustrated, but the present disclosure is not limited thereto. For example, at least one of the first, second, and third transistors T1, T2, and T3 may be a P-type transistor.

In addition, FIGS. 2 and 3 illustrate an embodiment in which all effective light sources configuring each light source unit LSU, that is, the light emitting elements LD, are connected in parallel, but embodiments are not limited thereto. For example, as shown in FIG. 4, the light source unit LSU of each pixel PXL may be configured to include at least two stages of series structure. In describing the embodiment of FIG. 4, a further detailed description of a configuration (for example, the pixel circuit PXC) similar to or the same as that of the embodiments of FIGS. 2 and 3 is omitted.

Referring to FIG. 4, the light source unit LSU may include at least two light emitting elements connected in series with each other. For example, the light source unit LSU may include a first light emitting element LD1, a second light emitting element LD2, and a third light emitting element LD3 connected in series in a forward direction between the first power VDD and the second power VSS. The first, second, and third light emitting elements LD1, LD2, and LD3 may configure each effective light source.

Herein, when a specific light emitting element is referred to among the first, second, and third light emitting elements LD1, LD2, LD3, a corresponding light emitting element is referred to as the "first light emitting element LD1," the "second light emitting element LD2," or the "third light emitting element LD3." In addition, when at least one of the first, second, and third light emitting elements LD1, LD2, and LD3 is arbitrarily referred to or the first, second, and third light emitting elements LD1, LD2, and LD3 are collectively referred to, at least one of the first, second, and third light emitting elements LD1, LD2, and LD3 or the first, second, and third light emitting elements LD1, LD2, and LD3 are referred to as the "light emitting element (LD)" or the "light emitting elements (LD)."

A first end (for example, a P-type end) of the first light emitting element LD1 is connected to the first power VDD via the first electrode ELT1 (that is, the first pixel electrode) of the light source unit LSU. In addition, a second end (for example, an N-type end) of the first light emitting element LD1 is connected to a first end (for example, a P-type end) of the second light emitting element LD2 through a first intermediate electrode IET1.

The first end of the second light emitting element LD2 is connected to the second end of the first light emitting element LD1. In addition, a second end (for example, an N-type end) of the second light emitting element LD2 is connected to a first end (for example, a P-type end) of the third light emitting element LD3 through a second intermediate electrode IET2.

The first end of the third light emitting element LD3 is connected to the second end of the second light emitting element LD2. In addition, a second end (for example, an N-type end) of the third light emitting element LD3 may be connected to the second power VSS via the second electrode ELT2 (that is, the second pixel electrode) or the like of the light source unit LSU. In the above-described embodiment, the first, second, and third light emitting elements LD1, LD2, and LD3 may be sequentially connected in series between the first and second electrodes ELT1 and ELT2 of the light source unit LSU.

In FIG. 4, an embodiment in which the light emitting elements LD are connected in a three-stage series structure is shown, but the present disclosure is not limited thereto, and the two light emitting elements LD may be connected in a two-stage series structure, or four or more light emitting elements LD may be connected in a four- or more stage series structure.

Assuming that the same luminance is expressed using the light emitting elements LD of the same condition (for example, the same size and/or number), in the light source unit LSU of a structure in which the light emitting elements LD are connected in series, a voltage applied between the first and second electrodes ELT1 and ELT2 may increase and a magnitude of the driving current flowing through the light source unit LSU may decrease compared to the light source unit LSU of a structure in which the light emitting elements LD are connected in parallel. Therefore, when the light source unit LSU of each pixel PXL is configured by applying the series structure, a panel current flowing through the display panel PNL may be reduced.

As in the above-described embodiments, each light source unit LSU may include the plurality of light emitting elements LD connected in the forward direction between the first power VDD and the second power VSS and configuring each effective light source. In addition, the connection structure between the light emitting elements LD may be variously changed according to an embodiment. For example, the light emitting elements LD may be connected only in series or parallel to each other, or may be connected in a serial/parallel mixed structure.

Figure 5:
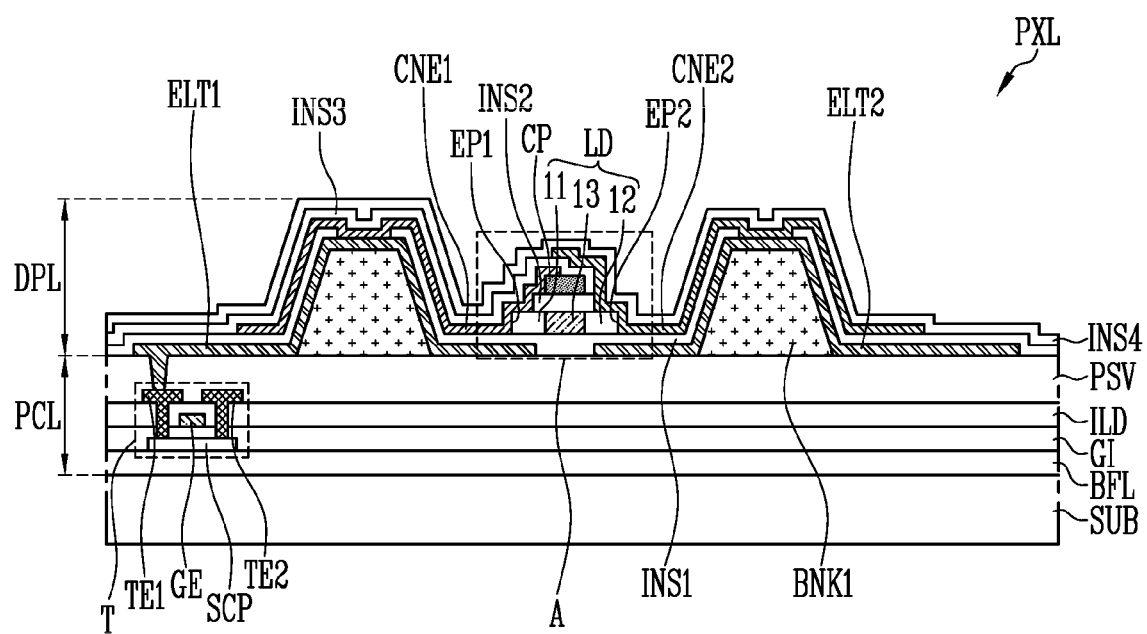
FIGS. 5 and 6 are cross-sectional views illustrating a display device according to an embodiment.
Figure 6:
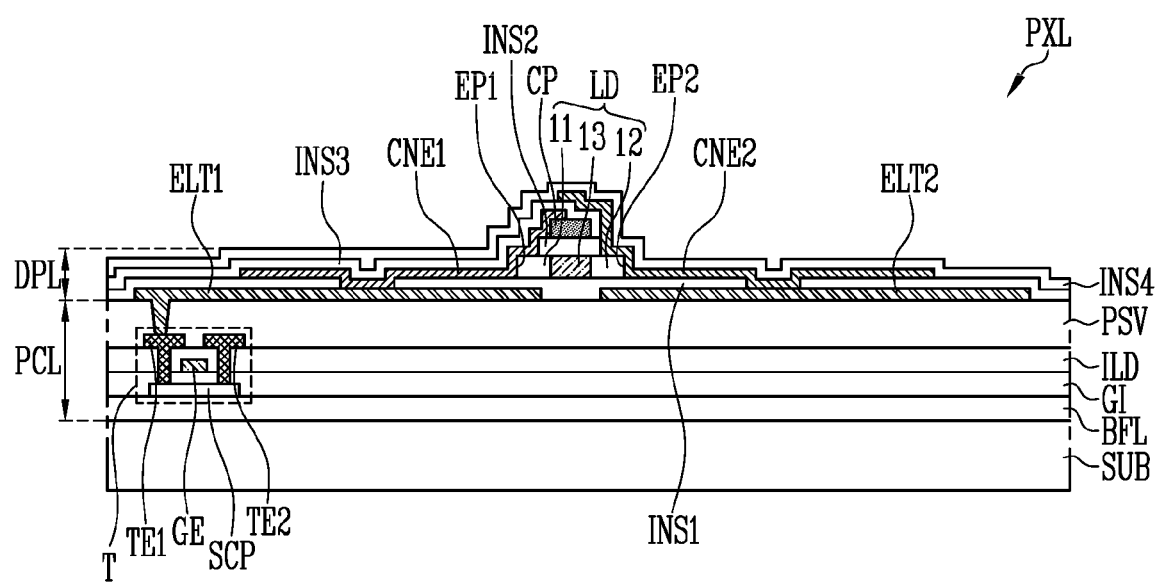
Figure 7:
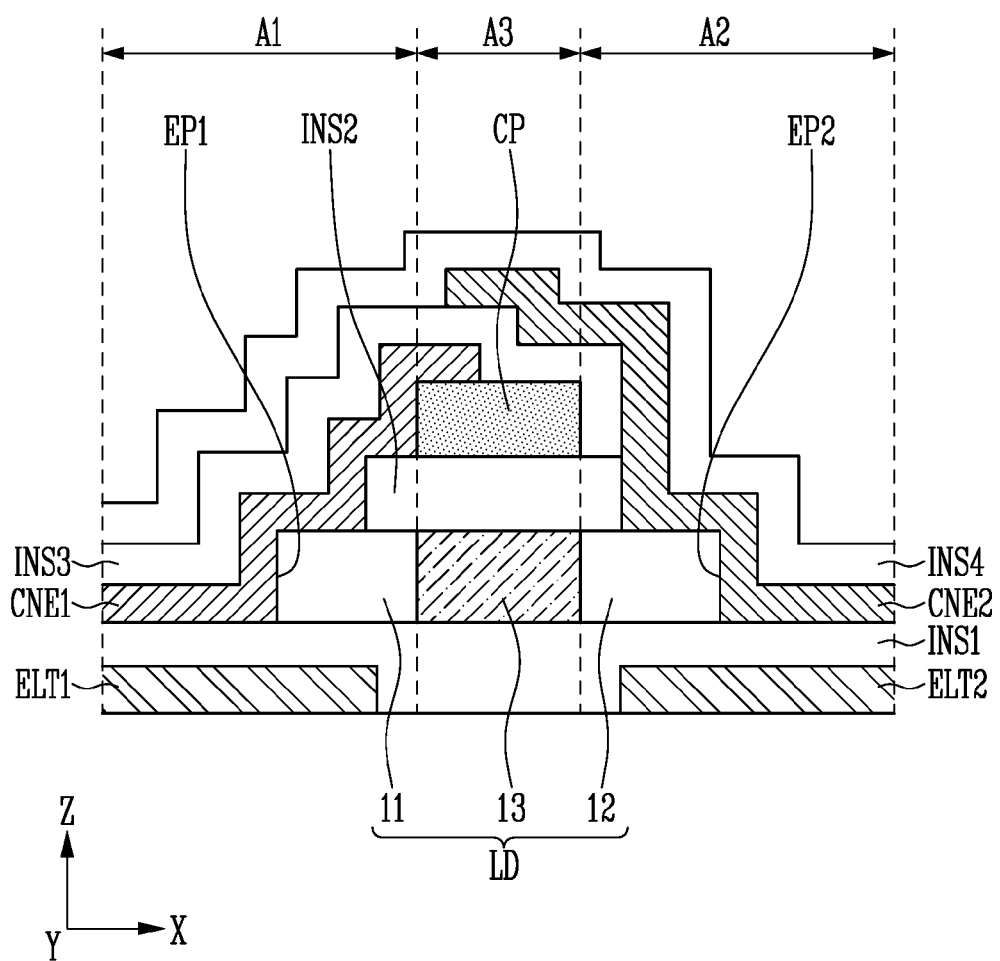
FIG. 7 is an enlarged view of a region "A" of FIG. 5.

FIGS. 5 and 6 are cross-sectional views illustrating a display device according to an embodiment; and FIG. 7 is an enlarged view of a region "A" of FIG. 5.

In FIGS. 5 and 6, a cross-section of the display device, in particular, the display panel PNL provided in the display device, centering on a region, in which any one pixel PXL configured of the first pixel PXL1, the second pixel PXL2, and the third pixel PXL3 adjacent to each other is disposed, is shown.

In addition, FIGS. 5 and 6 schematically show a structure of each pixel PXL centered on one light emitting element LD, and, for convenience of description, a transistor T (for example, the first transistor T1 of FIG. 2 or the like) connected to the first electrode ELT1 among various circuit elements configuring the pixel circuit PXC is shown. Herein, when it is not necessary to specify the first transistor T1 separately, the first transistor T1 may also be collectively referred to as the "transistor T".

However, a structure, a position of each layer, and/or the like of the transistors T are/is not limited to the embodiment shown in FIG. 5, and may be variously changed according to an embodiment. In addition, in an embodiment, the transistors T configuring each pixel circuit PXC may have a structure substantially the same as or similar to each other, but are not limited thereto. For example, in another embodiment, at least one of the transistors T configuring the pixel circuit PXC may have a cross-sectional structure different from that of the remaining transistors T, and/or may be disposed on a layer different from that of the remaining transistors T.

Referring to FIGS. 5 and 6, the pixel PXL and the display device including the same may include the substrate SUB, a circuit layer PCL disposed on a surface of the substrate SUB, and a display layer DPL.

The circuit layer PCL may include circuit elements configuring the pixel circuit PXC of each pixel PXL and various lines connected thereto. The display layer DPL may include electrodes (for example, the first and second electrodes ELT1 and ELT2 and/or first and second contact electrodes CNE1 and CNE2) configuring the light source unit LSU of each pixel PXL and the light emitting elements LD.

The circuit layer PCL may include at least one circuit element electrically connected to the light emitting elements LD of each pixel PXL. For example, the circuit layer PCL may include a plurality of transistors T configuring the pixel circuit PXC of each pixel PXL. In addition, the circuit layer PCL may further include at least one power line and/or signal line connected to each pixel circuit PXC and/or the light source unit LSU.

In addition, the circuit layer PCL may include a plurality of insulating layers. For example, the circuit layer PCL may include a buffer layer BFL, a gate insulating layer GI, an interlayer insulating layer ILD, and/or a passivation layer PSV sequentially stacked on a surface of the substrate SUB. In addition, the circuit layer PCL may selectively further include at least one light blocking pattern (not shown) disposed under at least some of the transistors T.

The buffer layer BFL may prevent or substantially prevent diffusion of an impurity into each circuit element. The buffer layer BFL may be configured as a single layer, but may be configured as multiple layers of at least two or more layers. When the buffer layer BFL is provided as multiple layers, each layer may be formed of the same material or may be formed of different materials. Various circuit elements such as the transistors T and various lines connected to the circuit elements may be disposed on the buffer layer BFL. However, the buffer layer BFL may be omitted according to an embodiment. In this case, at least one circuit element and/or line may be directly disposed on a surface of the substrate SUB.

Each transistor T may include a semiconductor pattern SCP, a gate electrode GE, and transistor electrodes TE1 and TE2. In FIG. 5, an embodiment in which each transistor T includes the first and second transistor electrodes TE1 and TE2 formed separately from the semiconductor pattern SCP is shown, but embodiments are not limited thereto. For example, in another embodiment, the first transistor electrode TE1 and/or the second transistor electrode TE2 provided in at least one transistor T may be integrated with each semiconductor pattern SCP.

The semiconductor pattern SCP may be disposed on the buffer layer BFL. For example, the semiconductor pattern SCP may be disposed between the substrate SUB on which the buffer layer BFL is formed and the gate insulating layer GI. The semiconductor pattern SCP may include a first region that is in contact with each first transistor electrode TE1, a second region that is in contact with each second transistor electrode TE2, and a channel region positioned between the first and second regions. According to an embodiment, one of the first and second regions may be a source region and the other may be a drain region.

According to an embodiment, the semiconductor pattern SCP may be a semiconductor pattern formed of polysilicon, amorphous silicon, oxide semiconductor, or the like. In addition, the channel region of the semiconductor pattern SCP may be an intrinsic semiconductor as a semiconductor pattern that is not doped with an impurity, and each of the first and second regions of the semiconductor pattern SCP may be a semiconductor pattern doped with an impurity (e.g., a predetermined impurity).

In an embodiment, the semiconductor patterns SCP of the transistors T configuring each pixel circuit PXC may be formed of a same (same or substantially the same) or similar material. For example, the semiconductor pattern SCP of the transistors T may be formed of a same material among polysilicon, amorphous silicon, and oxide semiconductor.

In another embodiment, some of the transistors T and others of the transistors T may include semiconductor patterns SCP formed of different materials. For example, the semiconductor pattern SCP of some of the transistors T may be formed of polysilicon or amorphous silicon, and the semiconductor pattern SCP of the others of the transistors T may be formed of oxide semiconductor.

The gate insulating layer GI may be disposed on the semiconductor pattern SCP. For example, the gate insulating layer GI may be disposed between the semiconductor pattern SCP and the gate electrode GE. The gate insulating layer GI may be configured as a single layer or multiple layers, and may include any of various types of organic/inorganic insulating materials including silicon nitride (SiNx) or silicon oxide (SiOx).

The gate electrode GE may be disposed on the gate insulating layer GI. For example, the gate electrode GE may be disposed to overlap the semiconductor pattern SCP with the gate insulating layer GI interposed therebetween. In FIG. 5, the transistor T of a top-gate structure is shown, but in another embodiment, the transistor T may have a bottom-gate structure. In this case, the gate electrode GE may be disposed to overlap the semiconductor pattern SCP under the semiconductor pattern SCP.

The interlayer insulating layer ILD may be disposed on the gate electrode GE. For example, the interlayer insulating layer ILD may be disposed between the gate electrode GE and the first and second transistor electrodes TE1 and TE2. The interlayer insulating layer ILD may be configured as a single layer or multiple layers, and may include at least one inorganic insulating material and/or an organic insulating material. For example, the interlayer insulating layer ILD may include any of various types of organic/inorganic insulating materials including silicon nitride (SiNx), silicon oxide (SiOx), silicon oxynitride (SiOxNy), and the like, and a material of the interlayer insulating layer ILD is not particularly limited.

The first and second transistor electrodes TE1 and TE2 may be disposed on each semiconductor pattern SCP with at least one interlayer insulating layer ILD interposed therebetween. For example, the first and second transistor electrodes TE1 and TE2 may be disposed on different ends of the semiconductor pattern SCP with the gate insulating layer GI and the interlayer insulating layer ILD interposed therebetween. The first and second transistor electrodes TE1 and TE2 may be electrically connected to each semiconductor pattern SCP. For example, the first and second transistor electrodes TE1 and TE2 may be connected to the first and second regions of the semiconductor pattern SCP through respective contact holes passing through the gate insulating layer GI and the interlayer insulating layer ILD. According to an embodiment, one of the first and second transistor electrodes TE1 and TE2 may be a source electrode, and the other may be a drain electrode.

At least one transistor T provided in the pixel circuit PXC may be connected to at least one pixel electrode. For example, the transistor T may be electrically connected to the first electrode ELT1 of the pixel PXL through a contact hole passing through the passivation layer PSV.

In an embodiment, at least one signal line and/or power line connected to each pixel PXL may be disposed on a same layer as one electrode of the circuit elements configuring the pixel circuit PXC. For example, the scan line Si of each pixel PXL may be disposed on the same layer as the gate electrodes GE of the transistors T, and the data line Dj of each pixel PXL may be disposed on the same layer as the first and second transistor electrodes TE1 and TE2 of the transistors T.

The passivation layer PSV may be disposed on the circuit elements including the transistors T and/or the lines. The passivation layer PSV may be configured as a single layer or multiple layers, and may include at least one inorganic insulating material and/or an organic insulating material. For example, the passivation layer PSV may include at least an organic insulating layer and may substantially planarize a surface of the circuit layer PCL.

The display layer DPL may be disposed on the passivation layer PSV of the circuit layer PCL. The display layer DPL may include at least one pair of the first electrode ELT1 and the second electrode ELT2 disposed on each pixel PXL to configure each light source unit LSU, and at least one light emitting element LD connected between the first electrode ELT1 and the second electrode ELT2. In FIG. 5, one light emitting element LD disposed in each pixel PXL is shown, but, as in the embodiment of FIG. 2, for example, each pixel PXL may include a plurality of light emitting elements LD connected between the first and second electrodes ELT1 and ELT2. Therefore, herein, each embodiment is described under an assumption that the pixel PXL may include the plurality of light emitting elements LD.

In addition, the display layer DPL may further include a conductive pattern CP disposed on the light emitting elements LD, the first and second contact electrodes CNE1 and CNE2 for more stably connecting the light emitting elements LD between the first and second electrodes ELT1 and ELT2, and a bank BNK1 to protrude one region of each of the first and second electrodes ELT1 and ELT2 and/or the first and second contact electrodes CNE1 and CNE2 upward. In an embodiment, the display layer DPL may further include at least one conductive layer, an insulating layer, and/or the like.

The bank BNK1 may be disposed on the circuit layer PCL. The bank BNK1 may be formed in a separate type or integrated type pattern. The bank BNK1 may protrude in a height direction (for example, a third direction (Z-axis direction)) of the substrate SUB.

The bank BNK1 may have any of various shapes according to an embodiment. In an embodiment, the bank BNK1 may be a bank structure having a positive taper structure. For example, the bank BNK1 may be formed to have an inclined surface inclined at a constant angle with respect to the substrate SUB, as shown in FIG. 5. However, the disclosure is not limited thereto, and the bank BNK1 may have a sidewall of a curved surface, a step shape, or the like. For example, the bank BNK1 may have a cross-section of a semicircle shape, a semi-ellipse shape, or the like.

Electrodes and insulating layers disposed on the bank BNK1 may have a shape corresponding to the bank BNK1. For example, the first and second electrodes ELT1 and ELT2 and the first and second contact electrodes CNE1 and CNE2 may be disposed on one region of the bank BNK1 and may include an inclined surface or a curved surface having a shape corresponding to the shape of the bank BNK1. Similarly, a first insulating layer INS1, a third insulating layer INS3, and/or a fourth insulating layer INS4 may be disposed on the bank BNK1 and may include an inclined surface or a curved surface having a shape corresponding to the shape of the bank BNK1. However, the bank BNK1 may be omitted according to an embodiment. For example, as shown in FIG. 6, the bank BNK1 may be omitted and the first and second electrodes ELT1 and ELT2 may be directly disposed on the circuit layer PCL. In this case, the first and second electrodes ELT1 and ELT2 may be flatly disposed on the circuit layer PCL. Similarly, the first and second contact electrodes CNE1 and CNE2 and the first insulating layer INS1, the third insulating layer INS3, and/or the fourth insulating layer INS4 may also be flatly disposed on the circuit layer PCL.

The bank BNK1 may include an insulating material including at least one inorganic material and/or an organic material. For example, the bank BNK1 may include at least one layer of an inorganic film including any of various inorganic insulating materials, including silicon nitride (SiNx) or silicon oxide (SiOx). In another embodiment, the bank BNK1 may include at least one layer of an organic film, a photoresist film, and/or the like including any of various types of organic insulating materials, or may be configured of an insulator of a single layer or multiple layers including a combination of organic/inorganic materials. That is, the configuration material and/or the pattern shape of the bank BNK1 may be variously changed.

In an embodiment, the bank BNK1 may function as a reflective member. For example, the bank BNK1 may function as a reflective member that guides light emitted from each light emitting element LD in a desired direction (an upper direction of the pixel PXL) and improves light efficiency of the pixel PXL together with the first and second electrodes ELT1 and ELT2 provided thereon.

The first and second electrodes ELT1 and ELT2 configuring pixel electrodes of each pixel PXL may be disposed on the bank BNK1. The first electrode ELT1 and the second electrode ELT2 may be disposed in each pixel area where each pixel PXL is provided and/or formed. The first and second electrodes ELT1 and ELT2 may be disposed to be spaced apart from each other by an interval (e.g., a predetermined interval).

According to an embodiment, the first electrode ELT1 and/or the second electrode ELT2 may have a pattern that is separated for each pixel PXL or may have a pattern commonly connected to the plurality of pixels PXL. In an embodiment, before a process of forming the pixel PXL, in particular, before an alignment of the light emitting elements LD is completed, the first electrodes ELT1 of the pixels PXL disposed in the display area DA may be connected to each other, and the second electrodes ELT2 of the pixels PXL may be connected to each other. For example, before the alignment of the light emitting elements LD is completed, the first electrodes ELT1 of the pixels PXL may be formed integrally or non-integrally with each other and may be electrically connected to each other, and the second electrodes ELT2 of the pixels PXL may be formed integrally or non-integrally with each other and may be electrically connected to each other. When the first electrodes ELT1 or the second electrodes ELT2 of the pixels PXL are connected non-integrally with each other, the first electrodes ELT1 or the second electrodes ELT2 may be electrically connected to each other by at least one contact hole, a bridge pattern, and/or the like.

The first and second electrodes ELT1 and ELT2 may receive a first alignment signal (or a first alignment voltage) and a second alignment signal (or a second alignment voltage), respectively, in an alignment step of the light emitting elements LD. For example, one of the first and second electrodes ELT1 and ELT2 may receive an alignment signal of an alternating current form, and the other of the first and second electrodes ELT1 and ELT2 may receive an alignment voltage (for example, a ground voltage) having a constant voltage level. That is, an alignment signal (e.g., a predetermined alignment signal) may be applied to the first and second electrodes ELT1 and ELT2 in the alignment step of the light emitting elements LD. Accordingly, an electric field may be formed between the first and second electrodes ELT1 and ELT2. The light emitting elements LD supplied to each pixel area may self-align between the first and second electrodes ELT1 and ELT2 by the electric field. After the alignment of the light emitting elements LD is completed, the pixels PXL may be formed in a form in which individual driving is possible by disconnecting between at least the first electrodes ELT1 between the pixels PXL.

Each of the first and second electrodes ELT1 and ELT2 may be electrically connected to a predetermined circuit element, a power line, and/or a signal line. For example, the first electrode ELT1 may contact the first transistor electrode TE1 of the transistor T through a contact hole passing through the passivation layer PSV.

Each of the first and second electrodes ELT1 and ELT2 may include at least one conductive material. For example, each of the first and second electrodes ELT1 and ELT2 may include at least one conductive material, such as at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy including the same, a conductive oxide, such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO) or a fluorine tin oxide (FTO), and a conductive polymer, such as PEDOT, but is not limited thereto. For example, each of the first and second electrodes ELT1 and ELT2 may include other conductive materials including a carbon nanotube, graphene, or the like. In addition, each of the first and second electrodes ELT1 and ELT2 may be configured as a single layer or multiple layers. For example, each of the first and second electrodes ELT1 and ELT2 may include a reflective electrode layer including a reflective conductive material. In addition, each of the first and second electrodes ELT1 and ELT2 may selectively further include at least one of at least one layer of transparent electrode layer disposed on and/or under the reflective electrode layer, and at least one layer of a conductive capping layer covering an upper portion of the reflective electrode layer and/or the transparent electrode layer.

The first insulating layer INS1 may be disposed on one region of the first and second electrodes ELT1 and ELT2. For example, the first insulating layer INS1 may be formed to cover one region of each of the first and second electrodes ELT1 and ELT2, and may include an opening exposing another region of each of the first and second electrodes ELT1 and ELT2. For example, the first insulating layer INS1 may include an opening formed on an upper surface of the bank BNK1. The first and second electrodes ELT1 and ELT2 and the first and second contact electrodes CNE1 and CNE2 may be electrically connected to each other in a region in which the first insulating layer INS1 is opened. However, the first insulating layer INS1 may be omitted according to an embodiment. In this case, the light emitting elements LD may be directly disposed on the passivation layer PSV and/or one end of each of the first and second electrodes ELT1 and ELT2.

In an embodiment, the first insulating layer INS1 may be formed to firstly cover the first and second electrodes ELT1 and ELT2 entirely. After the light emitting elements LD are supplied and aligned on the first insulating layer INS1, the first insulating layer INS1 may be partially opened to expose a region of the first and second electrodes ELT1 and ELT2. For example, the first insulating layer INS1 may have an opening exposing a region of the first and second electrodes ELT1 and ELT2 on the upper surface of the bank BNK1, and may partially cover the inclined surfaces or the curved surfaces of the first and second electrodes ELT1 and ELT2. In another embodiment, after the supply and the alignment of the light emitting elements LD are completed, the first insulating layer INS1 may be patterned in a form of an individual pattern that is locally disposed only under the light emitting elements LD. The first insulating layer INS1 may be formed to cover the first and second electrodes ELT1 and ELT2 after the first and second electrodes ELT1 and ELT2 are formed. Accordingly, the first and second electrodes ELT1 and ELT2 may be prevented or substantially prevented from being damaged in a subsequent process.

The first insulating layer INS1 may be configured as a single layer or multiple layers, and may include at least one inorganic insulating material and/or an organic insulating material. For example, the first insulating layer INS1 may include any of various types of organic/inorganic insulating materials, such as silicon nitride (SiNx), silicon oxide (SiOx), or aluminum oxide (AlOx).

The light emitting elements LD may be disposed on the first and second electrodes ELT1 and ELT2 and the first insulating layer INS1. In an embodiment, the light emitting element LD may be provided in a rod shape extending along a direction. Each of the light emitting elements LD may include a first semiconductor layer 11, a second semiconductor layer 12, and an active layer 13 disposed between the first and second semiconductor layers 11 and 12. In an embodiment, the first semiconductor layer 11 may be disposed at a first end EP1 of the light emitting element LD, and the second semiconductor layer 12 may be disposed at a second end EP2 of the light emitting element LD.

In an embodiment, the light emitting element LD may have a size as small as nanometer scale to micrometer scale. For example, each of the light emitting elements LD may have a diameter (or width) and/or a length of a range from nanometer scale to micrometer scale. However, the size of the light emitting element LD is not limited thereto, and the size of the light emitting element LD may be variously changed according to a design condition of various devices, for example, a display device or the like, using a light emitting device, which uses the light emitting element LD as a light source.

The first semiconductor layer 11 may be a semiconductor layer having a first conductivity type. For example, the first semiconductor layer 11 may include a P-type semiconductor layer. For example, the first semiconductor layer 11 may include any of InAlGaN, GaN, AlGaN, InGaN, AlN, and InN, and may include a P-type semiconductor layer doped with a first dopant, such as Mg. However, the material configuring the first semiconductor layer 11 is not limited thereto, and the first semiconductor layer 11 may be configured of any of various other materials.

The active layer 13 may be formed in a single quantum well structure or a multi-quantum well structure. A relative position of the active layer 13 between the first semiconductor layer 11 and the second semiconductor layer 12 may be variously changed according to a type of the light emitting element LD. According to an embodiment, a material such as AlGaN and InAlGaN may be used to form the active layer 13, and any of various other materials may configure the active layer 13.

The second semiconductor layer 12 may include a semiconductor layer of a type different from that of the first semiconductor layer 11. For example, the second semiconductor layer 12 may be a semiconductor layer having a second conductivity type. For example, the second semiconductor layer 12 may include an N-type semiconductor layer. For example, the second semiconductor layer 12 may include at least one semiconductor material of InAlGaN, GaN, AlGaN, InGaN, AlN, and InN, and may include an N-type semiconductor layer doped with a second dopant, such as any of Si, Ge, and Sn. However, the material configuring the second semiconductor layer 12 is not limited thereto, and any of various other materials may configure the second semiconductor layer 12.

When a voltage equal to or greater than a threshold voltage is applied to both ends of the light emitting element LD, an electron-hole pair is coupled in the active layer 13 and, thus, the light emitting element LD emits light. By controlling the light emission of the light emitting element LD using this principle, the light emitting element LD may be used as a light source of various light emitting devices including the pixel of the display device.

Although not shown in the drawing, the light emitting element LD may further include an insulating film provided on a surface. The insulating film may be formed on the surface of the light emitting element LD so as to surround at least an outer circumferential surface of the active layer 13, and may further surround a region of the first and second semiconductor layers 11 and 12. In addition, according to an embodiment, the light emitting element LD may additionally include at least one phosphor layer, an active layer, a semiconductor layer, and/or an electrode layer disposed on an end side of the first semiconductor layer 11 and/or the second semiconductor layer 12. That is, the type, structure, shape, and/or the like of the light emitting element LD may be variously changed.

In an embodiment, the light emitting elements LD may be first supplied and aligned between the first and second electrodes ELT1 and ELT2 in an active pattern ACT state, and then each dopant region may be doped to form the first semiconductor layer 11 and the second semiconductor layer 12. In general, when the light emitting elements LD including the first and second semiconductor layers 11 and 12 are supplied and aligned, some of the light emitting elements LD may be randomly disposed and may be aligned in a reverse direction between the first and second electrodes ELT1 and ELT2. In this case, even though a driving voltage (e.g., a predetermined driving voltage) (for example, a driving voltage of the forward direction) is applied between the first and second electrodes ELT1 and ELT2, a current substantially does not flow through the light emitting element LD aligned in the reverse direction, and, thus, the light emission efficiency may be reduced. Therefore, as described above, when each dopant region is doped to form the first semiconductor layer 11 and the second semiconductor layer 12 after the light emitting elements LD are first supplied and aligned between the first and second electrodes ELT1 and ELT2 in the active pattern ACT state, a bias degree of the light emitting elements LD may be improved, and, thus, the light emission efficiency of the display device may be improved. A further detailed description of the active pattern ACT is described later with reference to FIGS. 9 to 15.

Although not shown in the drawing, the display panel PNL may further include a partition wall (or a dam structure) that defines each emission area to which the light emitting elements LD are to be supplied. The light emitting elements LD may be supplied to a region in which the bank BNK1, the first and second electrodes ELT1 and ELT2, and the first insulating layer INS1 are formed, and may be aligned between the first and second electrodes ELT1 and ELT2. For example, the light emitting elements LD may be supplied to each pixel PXL through an inkjet method, a slit coating method, or any of various other methods, and may be aligned between the first and second electrodes ELT1 and ELT2 by an alignment signal (e.g., a predetermined alignment signal) (or alignment voltage) applied to each of the first and second electrodes ELT1 and ELT2.

A second insulating layer INS2 (or an insulating pattern) may be disposed on a region of the light emitting elements LD. For example, the second insulating layer INS2 may be disposed on a region of each of the light emitting elements LD to expose the first and second ends EP1 and EP2 of each of the light emitting elements LD. For example, the second insulating layer INS2 may be locally disposed on a region including a central region of each of the light emitting elements LD and may partially expose the first semiconductor layer 11 and/or the second semiconductor layer 12. When the second insulating layer INS2 is formed on the light emitting elements LD after the alignment of the light emitting elements LD is completed, the light emitting elements LD may be prevented or substantially prevented from being deviated from a position where the light emitting elements LD are aligned.

The second insulating layer INS2 may be formed in an independent pattern on the light emitting element LD, but is not limited thereto. According to an embodiment, the second insulating layer INS2 may be omitted, and, in this case, an end of each of the first and second contact electrodes CNE1 and CNE2 may be positioned directly on an upper surface of the light emitting elements LD.

The second insulating layer INS2 may be configured as a single layer or multiple layers, and may include at least one inorganic insulating material and/or an organic insulating material. For example, the second insulating layer INS2 may include any of various types of organic/inorganic insulating materials including silicon nitride (SiNx), silicon oxide (SiOx), aluminum oxide (AlOx), and a photoresist (PR) material.

The conductive pattern CP may be disposed on the second insulating layer INS2. In an embodiment, the conductive pattern CP may be directly disposed on the second insulating layer INS2 and may contact a surface of the second insulating layer INS2. The conductive pattern CP may be disposed to partially overlap the light emitting element LD in the third direction (Z-axis direction). In an embodiment, a width of the conductive pattern CP in a first direction (X-axis direction) may be less than a width of the light emitting element LD in the first direction (X-axis direction). FIG. 7 is referred to for a further detailed description of the conductive pattern CP.

Referring to FIG. 7, the display panel PNL may include a first region A1 overlapping the first semiconductor layer 11, a second region A2 overlapping the second semiconductor layer 12, and a third area A3 disposed between the first region A1 and the second region A2. The first region A1 may be a region where the first dopant is doped to form the first semiconductor layer 11, and the second region A2 may be a region where the second dopant is doped to form the second semiconductor layer 12.

In an embodiment, the conductive pattern CP may be disposed in the third region A3 to function as a mask in a doping process for the first region A1 and/or the second region A2. To this end, the conductive pattern CP may not overlap the first semiconductor layer 11 and/or the second semiconductor layer 12 in the third direction (Z-axis direction). In addition, the conductive pattern CP may overlap the active layer 13 of the light emitting element LD described above in the third direction (Z-axis direction). According to an embodiment, a width of the conductive pattern CP in the first direction (X-axis direction) may be the same (the same or substantially the same) as a width of the active layer 13 in the first direction (X-axis direction).

According to an embodiment, each dopant may be implanted into the conductive pattern CP in the doping process for the first region A1 and/or the second region A2. For example, the conductive pattern CP may include the first dopant and/or the second dopant, but is not limited thereto.

In addition, in the doping process for the first region A1 and/or the second region A2, a dopant may also be implanted to the insulating layer disposed between the first electrode ELT1 and the second electrode ELT2 and the conductive pattern CP in each region. For example, the first insulating layer INS1 of the first region A1 may include the first dopant, and the first insulating layer INS1 of the second region A2 may include the second dopant. In addition, the second insulating layer INS2 of the first region A1 may include the first dopant, and the second insulating layer INS2 of the second region A2 may include the second dopant, but the disclosure is not limited thereto. A further detailed description of the doping process is described later with reference to FIGS. 9 to 15.

Referring to FIG. 5 again, the contact electrodes CNE1 and CNE2 may be disposed on the light emitting element LD and the conductive pattern CP. The contact electrodes CNE1 and CNE2 may include a first contact electrode CNE1 electrically connected to the first electrode ELT1 and the first semiconductor layer 11, and a second contact electrode CNE2 electrically connected to the second electrode ELT2 and the second semiconductor layer 12.

The first and second contact electrodes CNE1 and CNE2 may be disposed on the first and second electrodes ELT1 and ELT2 to cover the exposed regions of each of the first and second electrodes ELT1 and ELT2. For example, the first and second contact electrodes CNE1 and CNE2 may be disposed on at least one region of each of the first and second electrodes ELT1 and ELT2 to be in direct/indirect contact with each of the first and second electrodes ELT1 and ELT2 at an upper portion of the bank BNK1 or around the bank BNK1. Accordingly, the first and second contact electrodes CNE1 and CNE2 may be electrically connected to the first and second electrodes ELT1 and ELT2, respectively.

In addition, the first and second ends EP1 and EP2 of the light emitting elements LD, which are not covered by the second insulating layer INS2, may be covered by the first and second contact electrodes CNE1 and CNE2, respectively. Accordingly, each of the first and second electrodes ELT1 and ELT2 may be electrically connected to the first end EP1 or the second end EP2 of the adjacent at least one light emitting element LD through the first and second contact electrodes CNE1 and CNE2.

In an embodiment, the first and second contact electrodes CNE1 and CNE2 may be sequentially formed in different layers on a surface of the substrate SUB. For example, the second contact electrode CNE2 may be disposed on the first contact electrode CNE1, and the third insulating layer INS3 may be disposed between the first contact electrode CNE1 and the second contact electrode CNE2. In an embodiment, the first contact electrode CNE1 may be disposed between the conductive pattern CP and the second contact electrode CNE2. In an embodiment, the first contact electrode CNE1 may be directly disposed on the conductive pattern CP, but is not limited thereto. According to an embodiment, the first contact electrode CNE1 may be disposed in the first region A1 and/or the third region A3 to function as a mask in a doping process for the second region A2. To this end, the first contact electrode CNE1 may not overlap the second semiconductor layer 12 in the third direction (Z-axis direction). In an embodiment, in the doping process for the second region A2, each dopant may be implanted into the first contact electrode CNE1. For example, the first contact electrode CNE1 may include the second dopant, but is not limited thereto. In addition, a formation order of the first and second contact electrodes CNE1 and CNE2 may be varied. For example, in another embodiment, the second contact electrode CNE2 may be first formed, and the third insulating layer INS3 may be formed to cover the second contact electrode CNE2 and the second insulating layer INS2.

The first and second contact electrodes CNE1 and CNE2 may be configured of any of various transparent conductive materials. For example, the first and second contact electrodes CNE1 and CNE2 may include at least one of any of various transparent conductive materials, such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO) or a fluorine tin oxide (FTO), and may be implemented to be substantially transparent or translucent to satisfy a certain transmittance (e.g., a predetermined transmittance). Accordingly, the light emitted from the light emitting elements LD through each of the first and second ends EP1 and EP2 may transmit the first and second contact electrodes CNE1 and CNE2 and may be emitted to the outside of the display panel PNL.

The third insulating layer INS3 may be disposed between the first contact electrode CNE1 and the second contact electrode CNE2 to cover the first contact electrode CNE1. In an embodiment, the third insulating layer INS3 may directly cover the second insulating layer INS2, the conductive pattern CP, and/or the first contact electrode CNE1. Accordingly, since the first and second contact electrodes CNE1 and CNE2 may be stably separated by the third insulating layer INS3, electrical stability between the first and second ends EP1 and EP2 of the light emitting elements LD may be secured. That is, occurrence of a short defect between the first and second ends EP1 and EP2 of the light emitting elements LD may be effectively prevented.

The third insulating layer INS3 may be configured as a single layer or multiple layers, and may include at least one inorganic insulating material and/or an organic insulating material. For example, the third insulating layer INS3 may include any of various types of organic/inorganic insulating materials, such as silicon nitride (SiNx), silicon oxide (SiOx), silicon oxynitride (SiOxNy), aluminum oxide (AlOx), and a photoresist (PR) material.

The fourth insulating layer INS4 may be disposed on the first and second contact electrodes CNE1 and CNE2 and the third insulating layer INS3. For example, the fourth insulating layer INS4 may cover the bank BNK1, the first and second electrodes ELT1 and ELT2, the first insulating layer INS1, the second insulating layer INS2, and/or the third insulating layer INS3, the light emitting elements LD, and the first and second contact electrodes CNE1 and CNE2.

The fourth insulating layer INS4 may be configured as a single layer or multiple layers, and may include at least one inorganic insulating material and/or organic insulating material. For example, the fourth insulating layer INS4 may include any of various types of organic/inorganic insulating materials, such as silicon nitride (SiNx), silicon oxide (SiOx), or aluminum oxide (AlOx).

In an embodiment, the fourth insulating layer INS4 may include a thin film encapsulation layer of a multilayer structure. For example, the fourth insulating layer INS4 may be configured of a thin film encapsulation layer of a multilayer structure including inorganic insulating layers of at least two layers and an organic insulating layer of at least one layer interposed between the inorganic insulating layers of the at least two layers. However, the fourth insulating layer INS4 is not limited thereto, and the configuration material and/or the structure of the fourth insulating layer INS4 may be variously changed.

In accordance with a display device according to the embodiment described above, after the light emitting elements LD are first supplied and aligned between the first and second electrodes ELT1 and ELT2 in the active pattern ACT state, the conductive pattern CP may be formed, and each dopant region may be doped to form the first semiconductor layer 11 having the first conductivity type and the second semiconductor layer 12 having the second conductivity type. Accordingly, the bias degree of the light emitting elements LD may be improved, and, thus, the light emission efficiency of the display device may be improved.

Herein, another embodiment is described. In the following embodiment, the same components as those previously described are referred to by the same reference numerals, and a repetitive description may be omitted or simplified.

Figure 8:
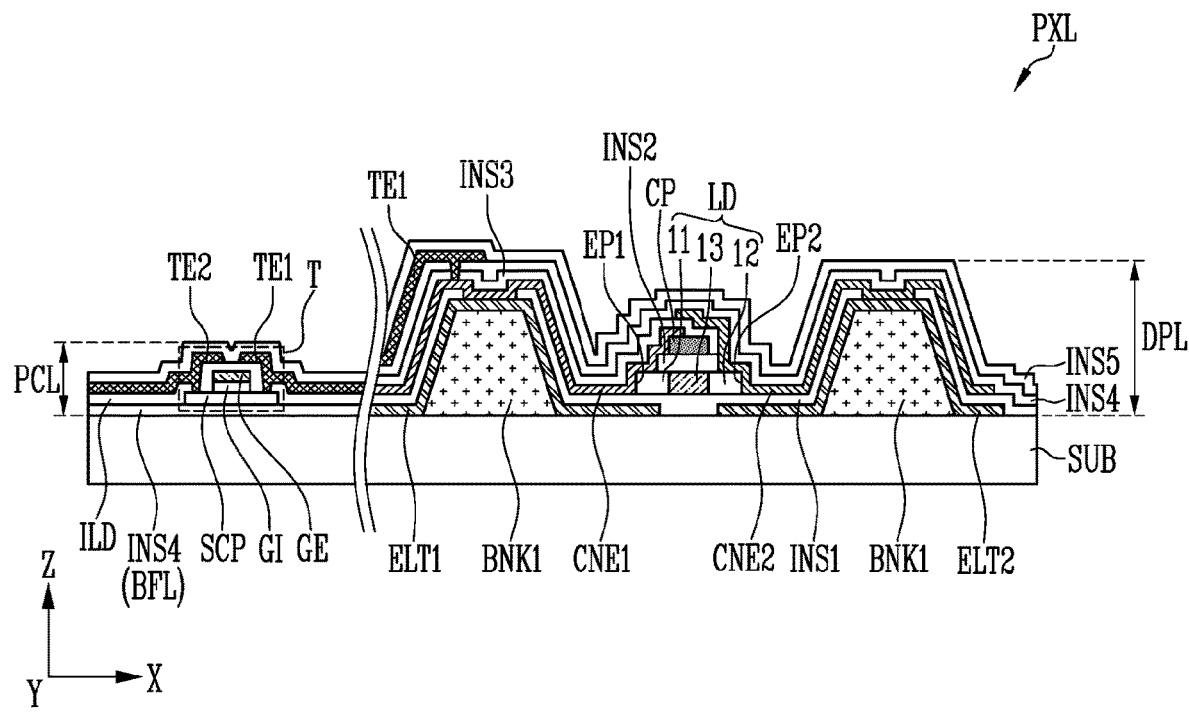
FIG. 8 is a cross-sectional view illustrating a display device according to an embodiment.

FIG. 8 is a cross-sectional view illustrating a display device according to an embodiment.

Referring to FIG. 8, the display device according to the present embodiment is different from the display device of the embodiments of FIGS. 1 to 7 in that the circuit layer PCL is formed after the display layer DPL is formed.

In an embodiment, the transistor T may be disposed on the fourth insulating layer INS4 of the above-described display layer DPL. The fourth insulating layer INS4 may function as the buffer layer BFL to prevent or substantially prevent diffusion of an impurity into a circuit element such as the transistor T. FIG. 8 illustrates a case in which the fourth insulating layer INS4 is disposed between the substrate SUB and the transistor T, but the present disclosure is not limited thereto. For example, a plurality of insulating layers including the fourth insulating layer INS4 may be further disposed between the substrate SUB and the transistor T, and a bank, a light blocking layer, and/or the like may be further disposed.

Each transistor T may include the semiconductor pattern SCP, the gate electrode GE, and the transistor electrodes TE1 and TE2. The semiconductor pattern SCP may be disposed on the fourth insulating layer INS4. The gate insulating layer GI may be disposed on the semiconductor pattern SCP. The gate electrode GE may be disposed to overlap the semiconductor pattern SCP with the gate insulating layer GI interposed therebetween. The interlayer insulating layer ILD may be disposed on the gate electrode GE. The first and second transistor electrodes TE1 and TE2 may be disposed on each semiconductor pattern SCP with the gate insulating layer GI and/or the interlayer insulating layer ILD interposed therebetween. The first and second transistor electrodes TE1 and TE2 may be connected to the first region and the second region of the semiconductor pattern SCP through contact holes passing through the interlayer insulating layer ILD. According to an embodiment, one of the first and second transistor electrodes TE1 and TE2 may be a source electrode, and the other may be a drain electrode.

The transistor T may be connected to at least one pixel electrode. For example, the first transistor electrode TE1 or the second transistor electrode TE2 of the transistor T may be electrically connected to the first electrode ELT1 of a corresponding pixel PXL through a contact hole passing through the fourth insulating layer INS4. A fifth insulating layer INS5 may be further disposed on the circuit layer PCL including the transistor T and/or the display layer DPL including the light emitting element LD. In an embodiment, the fifth insulating layer INS5 may directly cover the circuit layer PCL and/or the display layer DPL.

The fifth insulating layer INS5 may be configured as a single layer or multiple layers, and may include at least one inorganic insulating material and/or organic insulating material. For example, the fifth insulating layer INS5 may include any of various types of organic/inorganic insulating materials, such as silicon nitride (SiNx), silicon oxide (SiOx), or aluminum oxide (AlOx).

In an embodiment, the fifth insulating layer INS5 may include a thin film encapsulation layer of a multilayer structure. For example, the fifth insulating layer INS5 may be configured of a thin film encapsulation layer of a multilayer structure including inorganic insulating layers of at least two layers and an organic insulating layer of at least one layer interposed between the inorganic insulating layers of the at least two layers. However, the fifth insulating layer INS5 is not limited thereto, and the configuration material and/or the structure of the fifth insulating layer INS5 may be variously changed. Since other configurations of the transistor T are described with reference to FIG. 5 and the like, a repetitive description is omitted.

In accordance with the display device according to the above-described embodiment, after the light emitting elements LD are first supplied and aligned between the first and second electrodes ELT1 and ELT2 in the active pattern ACT state, the conductive pattern CP may be formed, and each dopant region may be doped to form the first semiconductor layer 11 having the first conductivity type and the second semiconductor layer 12 having the second conductivity type. Accordingly, the bias degree of the light emitting elements LD may be improved, and, thus, the light emission efficiency of the display device may be improved.

In addition, when the circuit layer PCL is formed after the display layer DPL is formed, the circuit element including the transistor T may be prevented or substantially prevented from being damaged even though a doping process of a high temperature is performed to form the first and second semiconductor layers 11 and 12 of the light emitting element LD. That is, the light emission efficiency of the display device may be improved and element reliability may be secured.

Herein, a method of manufacturing the display device according to the above-described embodiment is described.

FIGS. 9 to 15 are cross-sectional views illustrating a method of manufacturing a display device according to an embodiment.

In FIGS. 9 to 15, for convenience of description, a process task or step is shown centering on the region "A" of FIG. 5. Herein, components substantially the same as those of FIGS. 1 to 8 are denoted by the same reference numerals and further detailed description thereof may be omitted.

Figure 9:
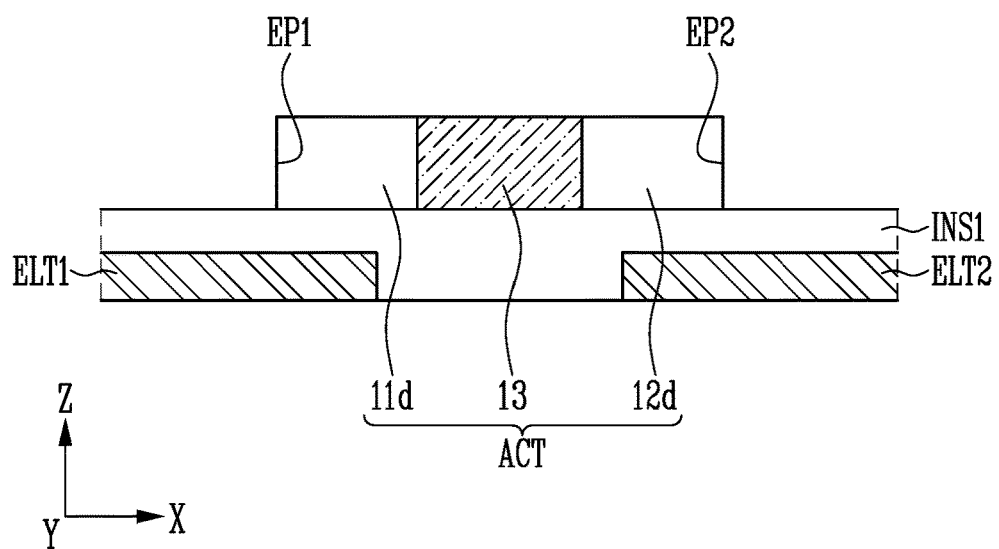
FIGS. 9 to 15 are cross-sectional views illustrating a method of manufacturing a display device according to an embodiment.

Referring to FIG. 9, first, the first insulating layer INS1 is formed on the first and second electrodes ELT1 and ELT2, and the active pattern ACT is supplied and aligned on the first insulating layer INS1.

The active pattern ACT may include a first dopant region 11d, a second dopant region 12d, and the active layer 13 disposed between the first and second dopant regions 11d and 12d. In an embodiment, the first and second dopant regions 11d and 12d may be intrinsic semiconductor layers as regions where an impurity is not doped. For example, each of the first and second dopant regions 11d and 12d may include any semiconductor material among InAlGaN, GaN, AlGaN, InGaN, AlN, and InN. However, the material configuring the first and second dopant regions 11d and 12d is not limited thereto, and the first and second dopant regions 11d and 12d may be configured of any of various other materials.

The active layer 13 may be formed in the single quantum well structure or the multi-quantum well structure. A relative position of the active layer 13 between the first and second dopant regions 11d and 12d may be variously changed. According to an embodiment, materials such as AlGaN and InAlGaN may be used to form the active layer 13, and any of various other materials may configure the active layer 13.

The light emitting elements LD may be supplied to each pixel PXL through an inkjet method, a slit coating method, or any of various other methods in the active pattern ACT state, and may be aligned between the first and second electrodes ELT1 and ELT2 by an alignment signal (e.g., a predetermined alignment signal) (or alignment voltage) applied to each of the first and second electrodes ELT1 and ELT2.

In a task or step of aligning the active patterns ACT, the alignment signal (e.g., predetermined alignment signal) may be applied to the first and second electrodes ELT1 and ELT2. Accordingly, an electric field may be formed between the first and second electrodes ELT1 and ELT2. The active patterns ACT supplied to each pixel PXL may be polarized between the first and second electrodes ELT1 and ELT2 by the electric field and may be self-aligned.

Figure 10:
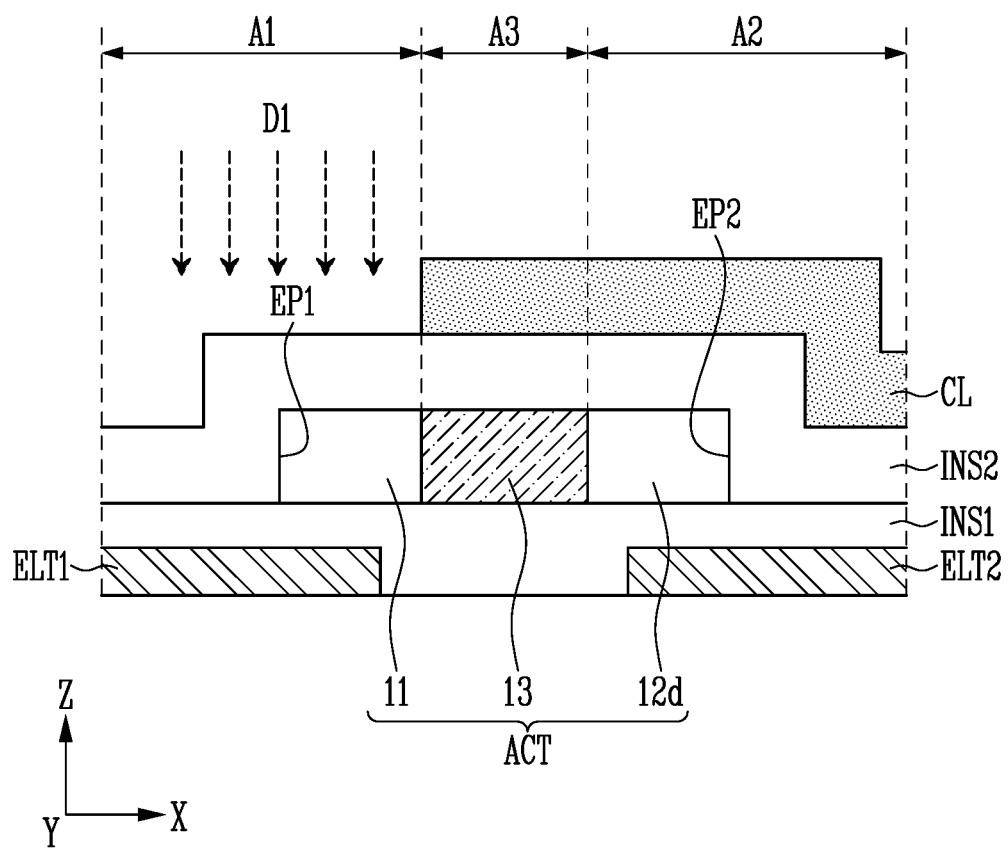

Referring to FIG. 10, subsequently, the second insulating layer INS2 and a conductive material layer CL are formed on the active pattern ACT, and a first dopant D1 is doped in the first region A1. The first semiconductor layer 11 having the first conductivity type may be formed by doping the first dopant D1 in the first dopant region 11d of the active pattern ACT.

Doping of the first dopant D1 may be performed by any of various methods, but ion implantation may be used as an example. In an embodiment, the first dopant D1 may be a P-type dopant and may include Mg or the like, but is not limited thereto.

According to an embodiment, the conductive material layer CL may function as a mask in the doping process for the first region A1. To this end, the conductive material layer CL may be disposed to expose the first dopant region 11d of the active pattern ACT and cover the second dopant region 12d and/or the active layer 13. That is, the conductive material layer CL may be disposed in the second region A2 and/or the third region A3. However, the disclosure is not limited thereto, and a separate doping mask may be added according to an embodiment.

According to an embodiment, the first dopant D1 may also be implanted into the conductive material layer CL, the first insulating layer INS1, and/or the second insulating layer INS2 of the first region A1 in the doping process of the first region A1, but is not limited thereto.

Figure 11:
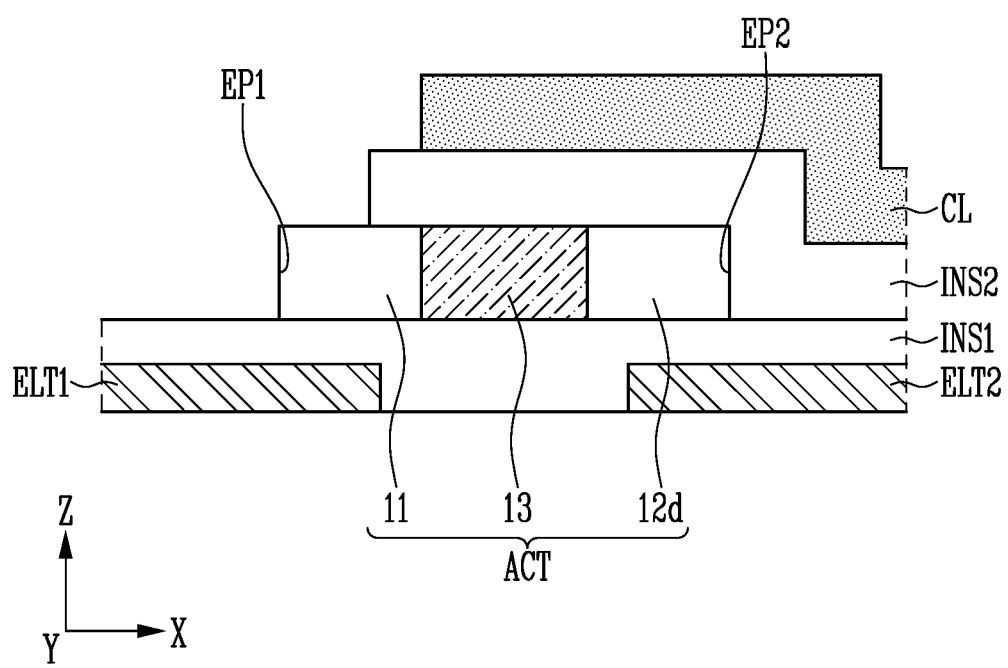

Referring to FIG. 11, subsequently, the second insulating layer INS2 is partially patterned such that the first end EP1 of the active pattern ACT is exposed. Accordingly, the first semiconductor layer 11 may be at least partially exposed by the second insulating layer INS2.

Figure 12:
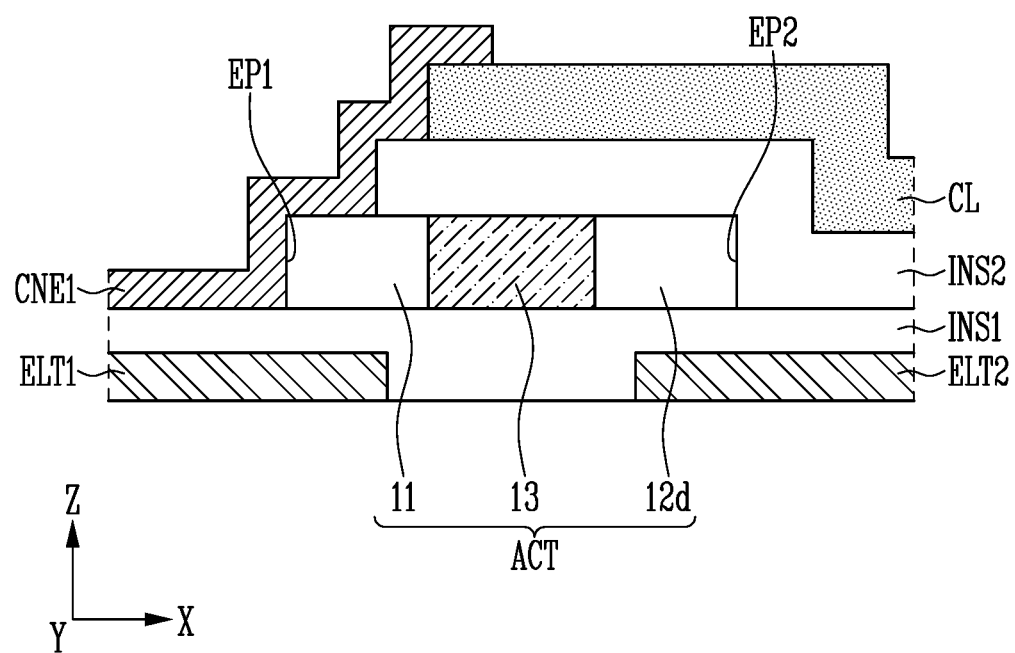

Referring to FIG. 12, subsequently, the first contact electrode CNE1 is formed on the first end EP1 of the active pattern ACT exposed by the second insulating layer INS2. Accordingly, the first semiconductor layer 11 may be electrically connected to the first electrode ETL1 through the first contact electrode CNE1.

Figure 13:
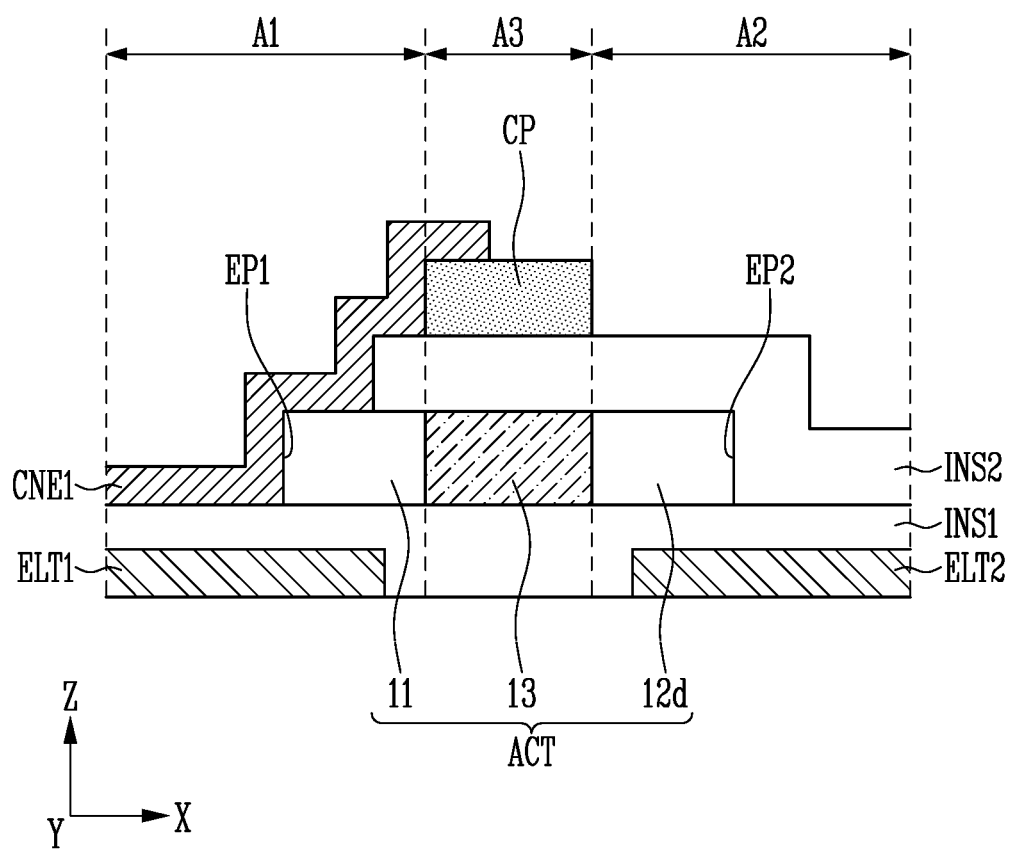

Referring to FIG. 13, subsequently, the conductive material layer CL is patterned to form the conductive pattern CP. For example, the conductive material layer CL of the second region A2 may be etched to form the conductive pattern CP in the third region A3. That is, the conductive pattern CP may be formed to overlap the active layer 13 of the active pattern ACT.

Figure 14:
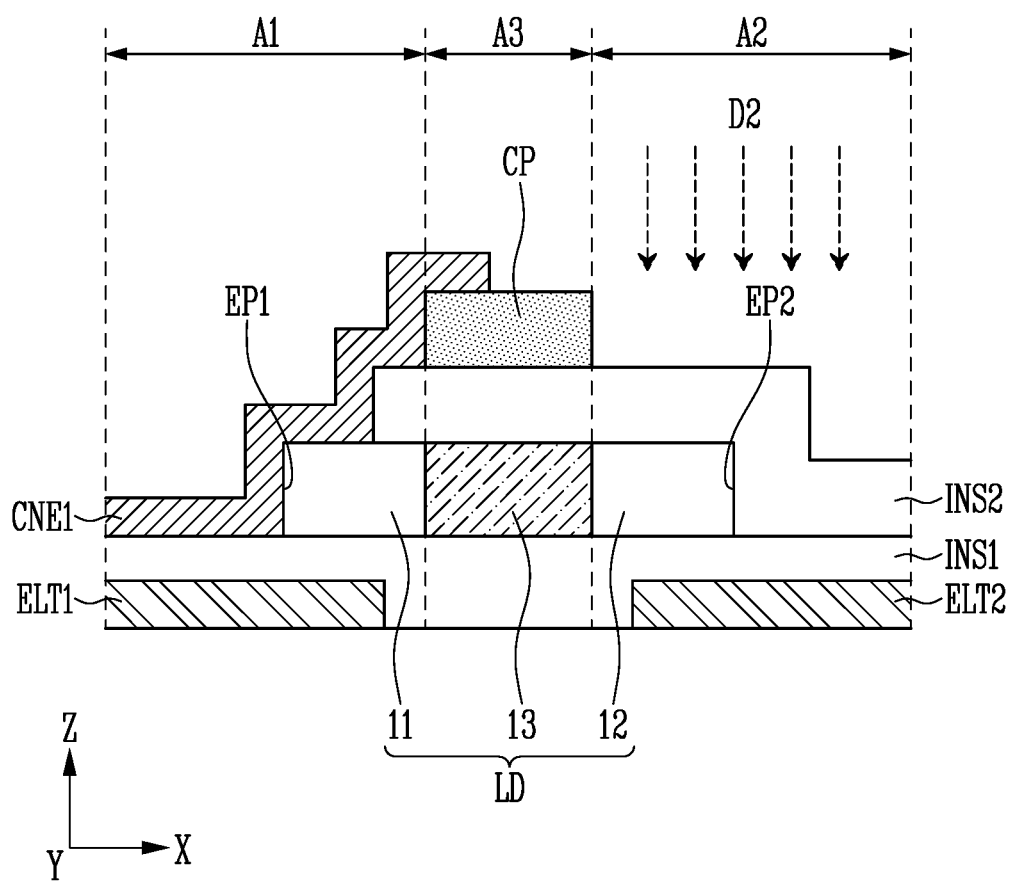

Referring to FIG. 14, subsequently, a second dopant D2 is doped in the second region A2. The second semiconductor layer 12 having the second conductivity type may be formed by doping the second dopant D2 in the second dopant region 12d of the active pattern ACT.

Doping of the second dopant D2 may be performed by any of various methods, but ion implantation may be used as an example. In an embodiment, the second dopant D2 may be an N-type dopant, and may include Si, Ge, Sn, or the like, but is not limited thereto.

According to an embodiment, the conductive pattern CP and/or the first contact electrode CNE1 may function as a mask in the doping process of the second region A2. To this end, the conductive pattern CP may be disposed to expose the second dopant region 12d of the active pattern ACT and cover the active layer 13. In addition, the first contact electrode CNE1 may be disposed to expose the second dopant region 12d and cover the first semiconductor layer 11 and the active layer 13. That is, the conductive pattern CP and/or the first contact electrode CNE1 may be disposed in the first region A1 and/or the third region A3. However, the disclosure is not limited thereto, and a separate doping mask may be added according to an embodiment.

According to an embodiment, in the doping process of the second region A2, the second dopant D2 may also be implanted into the first insulating layer INS1 and/or the second insulating layer INS2 of the second region A2, but is not limited thereto.

Figure 15:
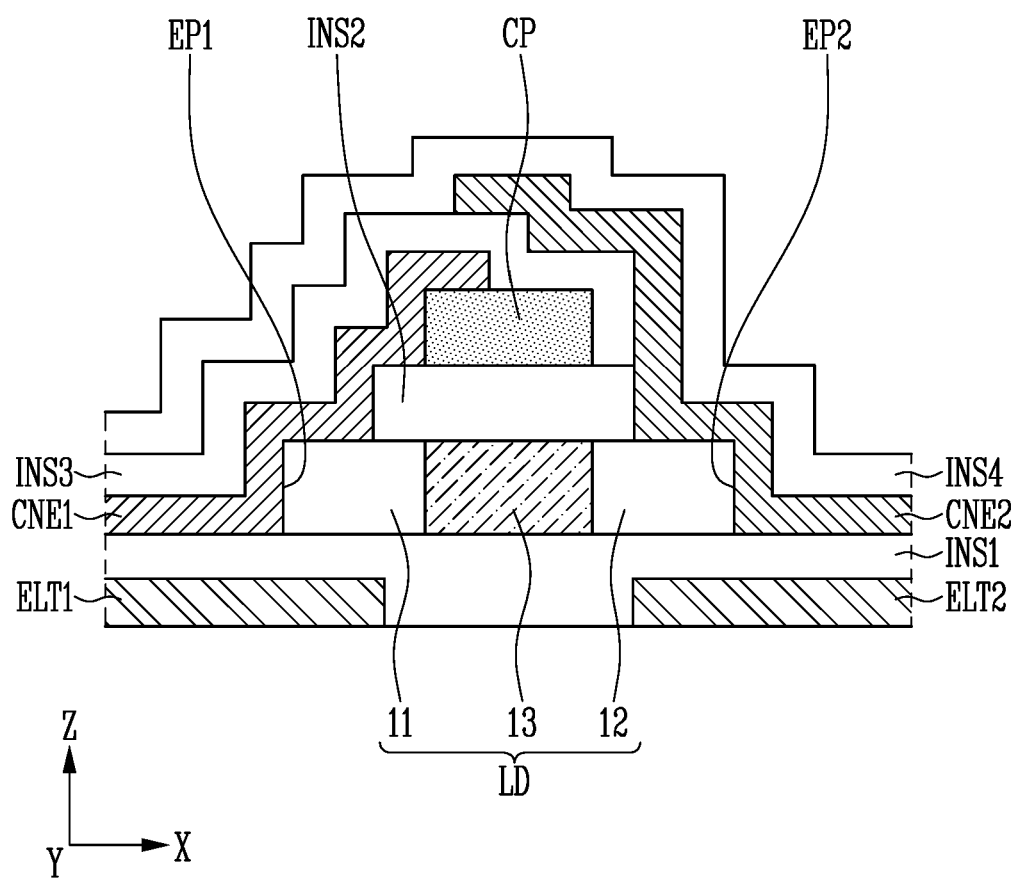

Referring to FIG. 15, the third insulating layer INS3, the second contact electrode CNE2, the fourth insulating layer INS4, and the like are sequentially formed on the first contact electrode CNE1, and, thus, the display device of FIG. 7 may be completed.

Although some embodiments have been described herein, those skilled in the art will understand that the disclosure may be implemented in various modified forms without departing from the above-described characteristics. Therefore, the disclosed embodiments and methods should be considered in a descriptive point of view rather than a limiting point of view. The scope of the disclosure is set forth in the claims, and all differences within the scope are to be construed as being included in the disclosure.

What is claimed is:

1. A display device comprising:
   a substrate comprising a plurality of pixels;
   a first electrode and a second electrode spaced apart from each other on the substrate;
   a light emitting element located between the first electrode and the second electrode; and
   a conductive pattern on the light emitting element,
   wherein the light emitting element comprises a first semiconductor layer, a second semiconductor layer, and an active layer between the first semiconductor layer and the second semiconductor layer,
   the conductive pattern overlaps the active layer and does not overlap the first semiconductor layer or the second semiconductor layer, and
   the conductive pattern and the first semiconductor layer comprise a first dopant, and the conductive pattern and the second semiconductor layer comprise a second dopant different from the first dopant.

2. The display device according to claim 1, further comprising:
   an insulating pattern between the light emitting element and the conductive pattern,
   wherein the insulating pattern partially exposes the first semiconductor layer and the second semiconductor layer.

3. The display device according to claim 1, further comprising:
   a first contact electrode electrically connected to the first electrode and the first semiconductor layer; and
   a second contact electrode electrically connected to the second electrode and the second semiconductor layer.

4. The display device according to claim 3, wherein the first contact electrode and the second contact electrode are on the conductive pattern.

5. The display device according to claim 4, wherein the first contact electrode does not overlap the second semiconductor layer.

6. The display device according to claim 3, further comprising:
   an insulating layer between the first contact electrode and the second contact electrode,
   wherein the insulating layer covers the conductive pattern.

7. The display device according to claim 3, further comprising:
   an insulating layer covering the first contact electrode and the second contact electrode; and
   a plurality of transistors on the insulating layer and electrically connected to the plurality of pixels,
   wherein the transistors are electrically connected to the first electrode or the second electrode through a contact hole passing through the insulating layer.

8. The display device according to claim 1, wherein a width of the conductive pattern in a first direction is less than a width of the light emitting element in the first direction.

9. The display device according to claim 1, wherein a width of the conductive pattern in a first direction is the same as a width of the active layer in the first direction.

10. The display device according to claim 1, further comprising an insulating layer between the first electrode and the second electrode and the conductive pattern.

11. A display device comprising:
a substrate comprising a plurality of pixels;
a first electrode and a second electrode spaced apart from each other on the substrate;
a light emitting element located between the first electrode and the second electrode;
a conductive pattern on the light emitting element;
a first contact electrode electrically connected to the first electrode and the first semiconductor layer; and
a second contact electrode electrically connected to the second electrode and the second semiconductor layer,
wherein the light emitting element comprises a first semiconductor layer, a second semiconductor layer, and an active layer between the first semiconductor layer and the second semiconductor layer, and
the conductive pattern overlaps the active layer and does not overlap the first semiconductor layer or the second semiconductor layer,
wherein the first contact electrode and the second contact electrode are on the conductive pattern, and
wherein the first contact electrode is between the conductive pattern and the second contact electrode.

12. A display device comprising:
a substrate comprising a plurality of pixels;
a first electrode and a second electrode spaced apart from each other on the substrate;
a light emitting element located between the first electrode and the second electrode;
a conductive pattern on the light emitting element; and
an insulating layer between the first electrode and the second electrode and the conductive pattern,
wherein the light emitting element comprises a first semiconductor layer, a second semiconductor layer, and an active layer between the first semiconductor layer and the second semiconductor layer, and
the conductive pattern overlaps the active layer and does not overlap the first semiconductor layer or the second semiconductor layer,
wherein the display device comprises a first region overlapping the first semiconductor layer and a second region overlapping the second semiconductor layer, and
the insulating layer in the first region comprises a first dopant.

13. The display device according to claim 12, wherein the first semiconductor layer comprises the first dopant.

14. The display device according to claim 13, wherein the conductive pattern comprises the first dopant.

15. The display device according to claim 12, wherein the insulating layer in the second region comprises a second dopant different from the first dopant.

16. The display device according to claim 15, wherein the second semiconductor layer comprises the second dopant.

17. The display device according to claim 16, wherein the conductive pattern comprises the second dopant.

18. A method of manufacturing a display device, the method comprising:
providing an active pattern between a first electrode and a second electrode that are spaced apart from each other; and
forming a light emitting element by doping a dopant region of the active pattern,
wherein forming the light emitting element comprises:
providing a conductive material layer exposing a first dopant region of the active pattern;
forming a first semiconductor layer by doping a first dopant in the first dopant region;
forming a conductive pattern exposing a second dopant region of the active pattern by patterning the conductive material layer; and
forming a second semiconductor layer by doping a second dopant different from the first dopant in the second dopant region.

19. The method according to claim 18, further comprising forming a first contact electrode on the first semiconductor layer.

20. The method according to claim 19, wherein the first contact electrode exposes the second dopant region.

21. The method according to claim 19, further comprising forming an insulating layer covering the first contact electrode and the conductive pattern.

22. The method according to claim 21, further comprising forming a second contact electrode on the second semiconductor layer.

23. The method according to claim 18, wherein the conductive material layer covers the second dopant region.

24. The method according to claim 18, wherein the active pattern comprises an active layer between the first dopant region and the second dopant region.

25. The method according to claim 24, wherein the conductive pattern is formed to overlap the active layer.

* * * * *